United States Patent
Bhattacharyya

(10) Patent No.: US 7,440,310 B2
(45) Date of Patent: Oct. 21, 2008

(54) MEMORY CELL WITH TRENCHED GATED THYRISTOR

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 11/444,990

(22) Filed: Jun. 1, 2006

(65) Prior Publication Data

US 2006/0227601 A1    Oct. 12, 2006

Related U.S. Application Data

(62) Division of application No. 10/925,120, filed on Aug. 24, 2004, now Pat. No. 7,145,186.

(51) Int. Cl.
*G11C 11/24* (2006.01)

(52) U.S. Cl. ........................ 365/149; 365/159
(58) Field of Classification Search ................ 365/149, 365/145, 159; 257/133, 146
See application file for complete search history.

(56) References Cited

U.S. PATENT DOCUMENTS

| | | | |
|---|---|---|---|
| 2,794,917 A | 6/1957 | Shockley | |
| 2,899,646 A | 8/1959 | Read | |
| 3,918,033 A | 11/1975 | Case et al. | |
| 3,964,085 A | 6/1976 | Kahng et al. | |
| 3,978,577 A | 9/1976 | Bhattacharyya et al. | |
| 4,488,262 A | 12/1984 | Basire et al. | |
| 4,692,785 A | 9/1987 | Wada | |
| 4,754,310 A | 6/1988 | Coe | |
| 4,791,604 A | 12/1988 | Lienau et al. | |
| 4,829,482 A | 5/1989 | Owen | |
| 4,870,470 A | 9/1989 | Bass, Jr. et al. | |
| 5,043,946 A | 8/1991 | Yamauchi et al. | |
| 5,144,390 A | 9/1992 | Matloubian | |
| 5,145,802 A | 9/1992 | Tyson et al. | |
| 5,382,814 A | 1/1995 | Ashley et al. | |
| 5,396,454 A | 3/1995 | Nowak | |
| 5,488,243 A | 1/1996 | Tsuruta et al. | |
| 5,557,569 A | 9/1996 | Smayling et al. | |

(Continued)

OTHER PUBLICATIONS

Bauer, F , et al., "Design aspects of MOS controlled thyristor elements", International Electron Devices Meeting 1989. *Technical Digest*, (1989), 297-300.

(Continued)

*Primary Examiner*—Gene N. Auduong
(74) *Attorney, Agent, or Firm*—Schwegman, Lundberg & Woessner, P.A.

(57) ABSTRACT

One aspect of this disclosure relates to a method for operating a memory cell. According to various embodiments, the method includes charging a storage node of the memory cell, including forward biasing a thyristor to switch the thyristor into a high conductance low impedance state, and storing a first charge type in the storage node and storing the first charge type in a trapping insulator separating a floating body of an access transistor from the thyristor. The method further includes discharging the storage node of the memory cell, including reverse biasing the thyristor into a low conductance high impedance state, and discharging the first charge type from the storage node and discharging the first charge type from the trapping insulator. Other aspects and embodiments are provided herein.

21 Claims, 17 Drawing Sheets

U.S. PATENT DOCUMENTS

| | | | |
|---|---|---|---|
| 5,587,604 | A | 12/1996 | Machesney et al. |
| 5,621,683 | A | 4/1997 | Young |
| 5,627,779 | A | 5/1997 | Odake et al. |
| 5,686,739 | A | 11/1997 | Baba |
| 5,801,993 | A | 9/1998 | Choi |
| 5,814,853 | A | 9/1998 | Chen |
| 5,963,476 | A | 10/1999 | Hung et al. |
| 5,981,335 | A | 11/1999 | Chi |
| 6,049,109 | A | 4/2000 | Omura et al. |
| 6,104,045 | A | 8/2000 | Forbes et al. |
| 6,118,152 | A | 9/2000 | Yamaguchi et al. |
| 6,201,734 | B1 | 3/2001 | Sansbury et al. |
| 6,229,161 | B1 | 5/2001 | Nemati et al. |
| 6,243,296 | B1 | 6/2001 | Sansbury |
| 6,248,626 | B1 | 6/2001 | Kumar et al. |
| 6,294,427 | B1 | 9/2001 | Furuhata et al. |
| 6,462,359 | B1 | 10/2002 | Nemati et al. |
| 6,545,297 | B1 | 4/2003 | Noble et al. |
| 6,574,143 | B2 | 6/2003 | Nakazato |
| 6,580,137 | B2 | 6/2003 | Parke |
| 6,600,188 | B1 | 7/2003 | Jiang et al. |
| 6,611,452 | B1 | 8/2003 | Han |
| 6,617,651 | B2 | 9/2003 | Ohsawa |
| 6,638,627 | B2 | 10/2003 | Potter |
| 6,653,174 | B1 | 11/2003 | Nemati et al. |
| 6,653,175 | B1 | 11/2003 | Nemati et al. |
| 6,653,665 | B2 | 11/2003 | Kajiyama |
| 6,660,616 | B2 | 12/2003 | Babcock et al. |
| 6,661,042 | B2 | 12/2003 | Hsu |
| 6,674,120 | B2 | 1/2004 | Fujiwara |
| 6,686,624 | B2 | 2/2004 | Hsu |
| 6,750,095 | B1 | 6/2004 | Bertagnoll et al. |
| 6,774,436 | B1 | 8/2004 | Yu et al. |
| 6,804,149 | B2 | 10/2004 | Ogura et al. |
| 6,812,504 | B2 | 11/2004 | Bhattacharyya |
| 6,845,034 | B2 * | 1/2005 | Bhattacharyya ............. 365/149 |
| 6,888,200 | B2 | 5/2005 | Bhattacharyya |
| 6,917,078 | B2 | 7/2005 | Bhattacharyya |
| 6,965,129 | B1 | 11/2005 | Horch et al. |
| 7,042,027 | B2 | 5/2006 | Bhattacharyya |
| 7,145,186 | B2 * | 12/2006 | Bhattacharyya ............. 257/133 |
| 7,149,109 | B2 | 12/2006 | Forbes |
| 7,184,312 | B2 | 2/2007 | Bhattacharyya |
| 7,224,024 | B2 | 5/2007 | Forbes |
| 7,245,535 | B2 * | 7/2007 | McCollum et al. ..... 365/185.18 |
| 7,291,519 | B2 | 11/2007 | Bhattacharyya |
| 7,323,380 | B2 | 1/2008 | Forbes |
| 7,339,830 | B2 | 3/2008 | Bhattacharyya |
| 2001/0040644 | A1 | 11/2001 | Vu et al. |
| 2002/0048190 | A1 | 4/2002 | King |
| 2002/0105023 | A1 | 8/2002 | Kuo et al. |
| 2003/0042534 | A1 | 3/2003 | Bhattacharyya et al. |
| 2003/0072126 | A1 | 4/2003 | Bhattacharyya |
| 2003/0089942 | A1 | 5/2003 | Bhattacharyya |
| 2003/0151948 | A1 | 8/2003 | Bhattacharyya et al. |
| 2003/0160277 | A1 | 8/2003 | Bhattacharyya et al. |
| 2004/0007734 | A1 | 1/2004 | Kato et al. |
| 2004/0014304 | A1 | 1/2004 | Bhattacharyya |
| 2004/0026728 | A1 | 2/2004 | Yoshida et al. |
| 2004/0041206 | A1 | 3/2004 | Bhattacharyya |
| 2007/0138555 | A1 | 6/2004 | Bhattacharyya |
| 2004/0246764 | A1 | 12/2004 | King |
| 2005/0001232 | A1 | 1/2005 | Bhattacharyya |
| 2005/0012119 | A1 | 1/2005 | Herner et al. |
| 2005/0026353 | A1 | 2/2005 | Bhattacharya |
| 2005/0026354 | A1 | 2/2005 | Bhattacharyya |
| 2005/0047251 | A1 | 3/2005 | Bhattacharyya |
| 2005/0098800 | A1 | 5/2005 | Herner et al. |
| 2005/0099839 | A1 | 5/2005 | Bhattacharyya |
| 2005/0247962 | A1 | 11/2005 | Bhattacharyya |
| 2005/0263763 | A1 | 12/2005 | Bhattacharyya |
| 2005/0269628 | A1 | 12/2005 | King |
| 2006/0244007 | A1 | 11/2006 | Bhattacharyya |
| 2006/0245244 | A1 | 11/2006 | Bhattacharyya |
| 2006/0246653 | A1 | 11/2006 | Bhattacharyya |
| 2006/0252206 | A1 | 11/2006 | Forbes |

OTHER PUBLICATIONS

Bhattacharyya, A., "Physical & Electrical Characteristics of LPCVD Silicon Rich Nitride", *ECS Technical Digest, J. Electrochem. Soc., 131*(11), 691 RDP, New Orleans, (1984), 469C.

Carter, R J., "Electrical Characterization of High-k Materials Prepared By Atomic Layer CVD", *IWGI*, (2001), 94-99.

Chang, H R., et al., "MOS trench gate field-controlled thyristor", *Technical Digest—International Electron Devices Meeting*, (1989), 293-296.

Choi, J D., et al., "A0.15 um NAND Flash Technology with ).11 um2 cell Size for 1 Gbit Flash Memory", *IEDM Technical Digest*, (2000), 767-770.

Fazan, P, et al., "Capacitor-Less 1-Transistor DRAM", *IEEE International SOI Conference*, (2002), 10-13.

Frohman-Bentchkowsky, D, "An integrated metal-nitride-oxide-silicon (MNOS) memory", *Proceedings of the IEEE, 57*(6), (Jun. 1969), 1190-1192.

Han, Kwangseok, "Characteristics of P-Channel Si Nano-Crystal Memory", *IEDM Technical Digest, International Electron Devices Meeting*, (Dec. 10-13, 2000), 309-312.

Jagar, S, "Single grain thin-film-transistor (TFT) with SOI CMOS performance formed by metal-induced-lateral-crystallization", *International Electron Devices Meeting 1999. Technical Digest*, (1999), 293-6.

Kumar, M. J., "Lateral Schottky Rectifiers for Power Integrated Circuits", *International Workshop on the Physics of Semiconductor Devices, 11th, 4746*, Allied Publishers Ltd., New Delhi, India, (2002), 414-421.

Lai, S K., et al., "Comparison and trends in Today's dominant E2 Technologies", *IEDM Technical Digest*, (1986), 580-583.

Nemati, F, et al., "A novel high density, low voltage SRAM cell with a vertical NDR device", *1998 Symposium on VLSI Technology Digest of Technical Papers*, (1998), 66-7.

Nemati, F, et al., "A novel thyristor-based SRAM cell (T-RAM) for high-speed, low-voltage, giga-scale memories", *International Electron Devices Meeting 1999. Technical Digest*, (1999), 283-6.

Ohsawa, Takashi, et al., "Memory design using one-transistor gain cell on SOI", *IEEE International Solid-State Circuits Conference. Digest of Technical Papers, vol. 1*, (2002), 452-455.

Okhonin, S., et al., "A SOI capacitor-less 1T-DRAM concept", *2001 IEEE International SOI Conference. Proceedings, IEEE. 2001*, (2000), 153-154.

Shinohe, T, et al., "Ultra-high di/dt 2500 V MOS assisted gate-triggered thyristors (MAGTs) for high repetition excimer laser system", *International Electron Devices Meeting 1989. Technical Digest*, (1989), 301-4.

Sze, S. M., "Table 3: Measured Schottky Barrier Heights", *In: Physics of Semiconductor Devices*, John Wiley & Sons, Inc., (1981), p. 291.

Tiwari, Sandip, et al., "Volatile and Non-Volatile Memories in Silicon with Nano-Crystal Storage", *Int'l Electron Devices Meeting: Technical Digest*, Washington, DC, (Dec. 1995), 521-524.

Van Meer, H, "Ultra-thin film fully-depleted SOI CMOS with raised G/S/D device architecture for sub-100 nm applications", *2001 IEEE International SOI Conference*, (2001), 45-6.

Zhang, H., "Atomic Layer Deposition of High Dielectric Constant Nanolaminates", *Journal of The Electrochemical Society, 148*(4), (Apr. 2001), F63-F66.

* cited by examiner

MEMORY CELL WITH TRENCHED GATED THYRISTOR

CROSS REFERENCE TO RELATED APPLICATIONS

This application is a divisional of U.S. application Ser. No. 10/925,120, filed Aug. 24, 2004, now U.S. Pat. No. 7,145,186 which is incorporated herein by reference.

This application is related to the following commonly assigned U.S. patent applications which are herein incorporated by reference in their entirety: "Gated Lateral Thyristor-Based Random Access Memory Cell (GLTRAM)," U.S. application Ser. No. 10/232,855, filed on Aug. 30, 2002, U.S. 20040041212; "One Transistor SOI Non-Volatile Random Access Memory Cell," U.S. application Ser. No. 10/232,846, filed on Aug. 30, 2002, U.S. 20040041208; and "Silicon on Insulator Read-Write Non-Volatile Memory Comprising Lateral Thyristor and Trapping Layer," U.S. application Ser. No. 10/840,792, filed May 6, 2004, U.S. 20050247962.

TECHNICAL FIELD

This disclosure relates generally to integrated circuits, and more particularly, to memory cells with gated thyristors.

BACKGROUND

Integrated circuit memory includes dynamic random access memory (DRAM) and static random access memory (SRAM). DRAM cells provide good memory density, but are relatively slow. A conventional DRAM cell includes an access transistor integrated with a relatively complex capacitor structure. A goal for a conventional DRAM cell design is to achieve a cell density of 8 $F^2$, where F is the minimum printable feature size. SRAM cells are faster but require more area than DRAM cells. A conventional SRAM cell includes four or six transistors with a cell density ranging from 50 $F^2$ to 100 $F^2$. A SRAM cell design goal is high performance, but the larger area associated with four-transistor and six-transistor memory cells limits the use of SRAM devices.

Negative Differential Resistance (NDR) devices have been used to reduce the number of elements per memory cell. However, NDR devices tend to suffer from problems such as high standby power consumption, high operating voltages, low speeds and complicated fabrication processes.

F. Nemati and J. D. Plummer have disclosed a two-device thyristor-based SRAM cell (referred to as TRAM) that includes an access transistor and a gate-assisted, vertical thyristor. The disclosed vertical p+/n/p/n+ thyristor is operated in a gate-enhanced switching mode to provide the memory cell with SRAM-like performance and DRAM-like density. The performance of the TRAM cell depends on the turn-off characteristics of the vertical thyristor, and the turn-off characteristics depend on the stored charge and carrier transit time in the p region of the p+/n/p/n+ thyristor. The turn-off characteristics for the vertical thyristor is improved from milliseconds to five nanoseconds by reverse biasing the thyristor for a write-zero operation and by using a gate to assist with turn-off switching of the thyristor by discharging the stored charge. Known memory cells with gated thyristors use a second word line on a separate level to gate the thyristor, and further use a separate anode contact (e.g. Vref node) for turning on the thyristor, both of which increases the complexity of the fabrication process and adversely affects the yield and the density of the memory cell.

Capacitor-less single transistor DRAM and associated gain cells have been proposed where the floating body charge defines the memory state and the channel conductance of the transistor. The change in body potential and the excess carrier lifetime in the floating body limits the memory state stability. A single transistor vertical gain cell uses body capacitor plates to enhance the storage capacity (US 20040042256). A non-volatile one-transistor SOI memory device stores charge in a trapping layer in the floating body to provide non-volatility of the memory states (US 20040041208).

It is desirable to develop memory devices that provide DRAM-like density with SRAM-like performance while eliminating elements from the memory cell design, such as capacitors, second word lines and separate thyristor anode contacts, that complicate the process for fabricating memory cells.

DETAILED DESCRIPTION

Figure 1:
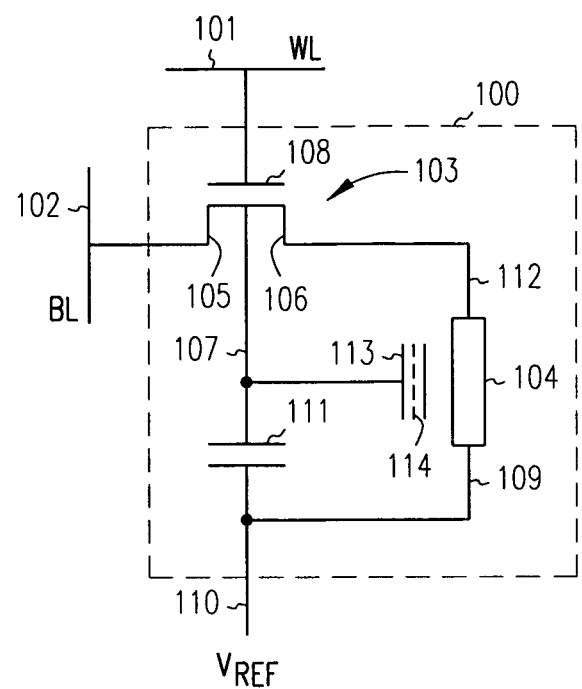
FIG. 1 illustrates a circuit schematic of a memory cell with an access transistor and an integrated thyristor, according to various embodiments.

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Disclosed herein, among other things, is a memory cell design that eliminates a second word line and a dedicated Vref node. The memory cell includes a vertical thyristor formed in a trench with a thyristor gate insulator separating the floating body of an access transistor from the thyristor. Charges introduced into the floating body of the access transistor acts to gate the thyristor, thus eliminating the need of a second word line. A thyristor end (the p+ anode region of the n+/p−/n−/p+ thyristor, for example) extends into the substrate eliminating a dedicated Vref node for each memory cell. The resulting memory cell is a cross-point memory cells defined by the intersection of a word line and a bit line, and still maintains benefits of gate-assisted thyristor based memory cells. The disclosed memory cell design only requires a shared bit line contact per cell and therefore, could approach an ideal 4 $F^2$ cell density for a cross-point array, which is twice as dense as that of a conventional DRAM cell, and further removes the complexity and scalability concerns associated with memory storage capacitors in the conventional DRAM cells. In various embodiments, the thyristor gate insulator includes a charge trapping insulator to enhance the stability of the memory states. The enhanced stability of the memory states, when added to the stable switching states of the thyristor, eliminates the need of memory refreshing associated with conventional DRAM cells. Furthermore, the improved logic separation of the memory states allows for faster sensing of the state of the memory cell. The above advantages provide improved cell density and speed.

One aspect of this disclosure relates to a memory cell. Various memory cell embodiments include an isolated semiconductor region separated from a bulk semiconductor region, an access transistor and a vertically-oriented thyristor formed in a trench extending between the isolated and bulk semiconductor regions. The access transistor includes a first diffusion region connected to a bit line, a second diffusion region to function as a storage node, a floating body region, and a gate separated from the floating body region by a transistor gate insulator. The isolated semiconductor region includes the first and second diffusion regions and the floating body region of the access transistor. The thyristor has a first end in contact with the bulk semiconductor region and a second end in contact with the storage node. The thyristor is electrically-isolated from the floating body region by a thyristor gate insulator.

One aspect of this disclosure relates to a method for forming a memory cell. According to various embodiments, an isolated semiconductor region is provided that is separated from a bulk semiconductor region. A trench is formed extending from the isolated semiconductor region to the bulk semiconductor region. A trapping insulator is formed along a surface of the trench. A thyristor is formed in the trench to extend between the isolated semiconductor region and the bulk semiconductor region. An access transistor is formed, where a first diffusion region and a second diffusion region are formed in the isolated semiconductor region and the second diffusion is merged with a thyristor end.

One aspect of this disclosure relates to a method for operating a memory cell. According to various embodiments, a memory operation command is received. In response to receiving a command to charge a storage node of the memory cell, a thyristor is forward biased to switch the thyristor into a high conductance low impedance state. The thyristor is gated using a floating body of an access transistor that is capacitively coupled to a gate of the access transistor. Gating the thyristor includes pulsing the gate of the access transistor. A first charge type is stored in the storage node and in a trapping insulator that separates the floating body of the access transistor from the thyristor. In response to receiving a command to discharge the storage node of the memory cell, the thyristor is reverse biased to switch the thyristor into a low conductance high impedance state. The thyristor is gated using the floating body of the access transistor. Gating the thyristor includes pulsing the gate of the access transistor. The first charge type is discharged from the storage node and a second charge type is stored in the trapping insulator. In response to receiving a read command, the gate of the access transistor is pulsed and a bit line is sensed for current attributed to stored charge on the storage node of the access transistor. If current is detected, it is determined that charge was stored on the storage node, and the charge is restored on the storage node. If current is not detected, it is determined that charge was not stored on the storage node.

Disclosed herein is a single switching floating-body transistor with a vertically integrated thyristor embedded in a trench. In a memory cell embodiment with an n-channel access transistor, a floating n+ node of the access transistor (also referred to as a switching transistor) is also the cathode of the thyristor (NPNP). The floating node forms the memory storage node. The thyristor is self-gated for fast "on" and "off" and various embodiments use charges trapped in the gate insulator trapping layer generated by the floating body of the access transistor to enhance memory cell stability. The anode of the trenched-thyristor (p+) is held at an appropriate reference potential and integrated with the p-silicon substrate. The resulting cross-point memory cell requires only a shared bit line contact and approaches a 4 $F^2$ density. Additionally, the stable memory states provide the high density cells with high SRAM-like performance, thus bridging the application requirements of both DRAM and SRAM. According to various embodiments, the floating body pass transistor and the memory device can be formed in SOI technology or can be fabricated in standard bulk technology.

Memory Structure

FIG. 1 illustrates a circuit schematic of a memory cell with an access transistor and an integrated thyristor, according to various embodiments. The memory cell 100 is formed at the cross-point of a word line 101, such as a polysilicon word line, for example) and a bit line 102 (such as a metal bit line, for example). The illustrated memory cell 100 includes an access transistor 103 and a thyristor 104. The access transistor 103 includes a first diffusion region 105 connected to the bit line 102, a second diffusion region 106 to function as a storage node, a floating body region 107, and a gate 108 connected to the word line 101. The thyristor 104 includes a first end 109 in contact with a bulk semiconductor region 110 (illustrated in the schematic as being separated from the floating body region by a capacitor 111, such as a buried oxide (BOX) capacitance), and further includes a second end 112 in contact with the storage node 106 of the access transistor. The illustrated thyristor 104 is electrically isolated from the floating body region 107 by a thyristor gate insulator 113. The gate 108 is capacitively-coupled to the floating body 107, which in turn is used to gate the thyristor 104 through a capacitively-coupled vertical thyristor gate. In various embodiments, the thyristor gate insulator 113 includes a charge trapping insulator, as illustrated by the dotted line 114. As provided below with respect to the cell operation, the charge trapping insulator traps charge to further enhance the stability of the memory cell states.

Figure 2:
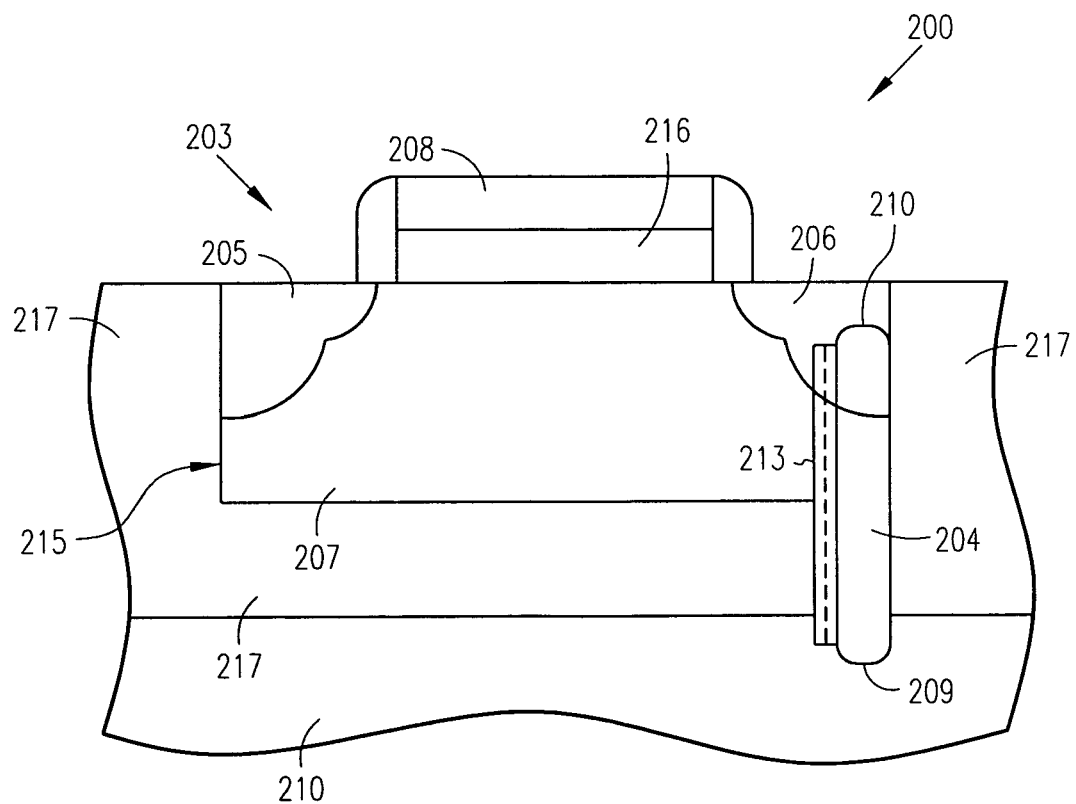
FIG. 2 illustrates a cross-sectional representation for the memory cell illustrated in the schematic of FIG. 1, according to various embodiments.

FIG. 2 illustrates a cross-sectional representation for the memory cell illustrated in the schematic of FIG. 1, according to various embodiments. The illustrated memory cell 200 includes an isolated semiconductor region 215 separated from a bulk semiconductor region 210. The memory cell 200 further includes an access transistor 203, with a first diffusion region 205 connected to a bit line, a second diffusion region 206 to function as a storage node, a floating body region 207, and a gate 208 separated from the floating body region 207 by a transistor gate insulator 216. The isolated semiconductor region 215 includes the first and second diffusion regions 205 and 206 and the floating body region 207 of the access transistor 203. Insulating regions 217, such as a buried oxide (BOX) region and shallow trench isolation (STI) regions, isolate semiconductor region 215. The illustrated memory cell 200 further includes a vertically-oriented thyristor 204 formed in a trench extending between the isolated semiconductor region 215 and the bulk semiconductor region 210. The thyristor 204 has a first end 209 in contact with the bulk semiconductor region 210 and a second end 212 in contact with the storage node 206 of the cell. A thyristor gate insulator 213 insulates the thyristor 204 from the floating body region 207.

One definition of a thyristor is a semiconductor device for high power switching. Thyristors also have been referred to as a semiconductor-controlled rectifier. One of ordinary skill in the art will appreciate, upon reading and comprehending this disclosure, that this disclosure is not limited to a particular type of semiconductor doping. Various memory cell embodiments include an n-channel access transistor and a p+/n−/p−/n+ thyristor, as illustrated in FIGS. 3 and 4.

Figure 3:
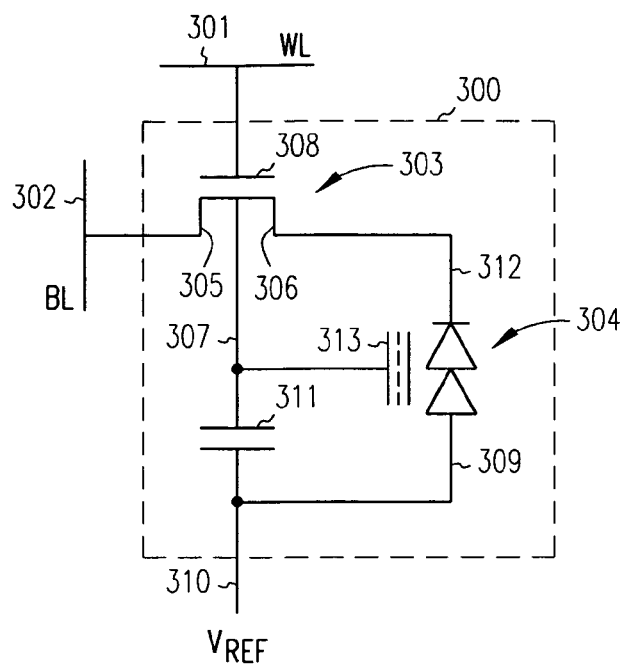
FIG. 3 illustrates a circuit schematic of a memory cell with an n-channel access transistor and an integrated thyristor, according to various embodiments.

FIG. 3 illustrates a circuit schematic of a memory cell 300 with an n-channel access transistor 303 and an integrated thyristor 304, according to various embodiments. The thyristor is illustrated as two diodes in the schematic of FIG. 3. For the illustrated p+/n−/p−/n+ thyristor, the first end 309 is referred to as an anode and the second end 312 is referred to as a cathode. The access transistor 303 includes a first diffusion region 305 connected to the bit line 302, a second diffusion region 306 to function as a storage node, a floating body region 307 separated from a bulk semiconductor region 310 by the illustrated capacitor 311, representative of a BOX capacitance, for example, and a gate 308 connected to the word line 301. The anode 309 of the thyristor 304 is in contact with the bulk semiconductor region 310, and the cathode 312 of the thyristor 304 is in contact with the storage node 306 of the n-channel access transistor 303. The illustrated thyristor 304 is insulated from the floating body region 307 by a thyristor gate insulator 313.

Figure 4:
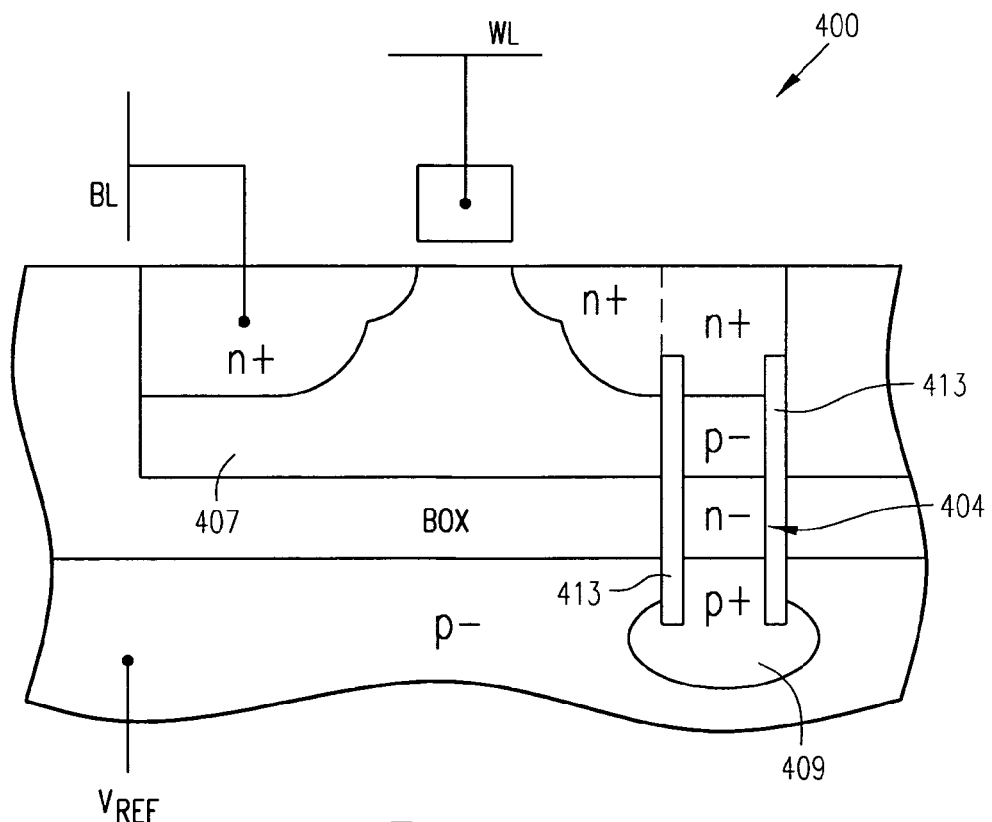
FIG. 4 illustrates a cross-sectional representation for the memory cell illustrated in the schematic of FIG. 3, according to various embodiments.

FIG. 4 illustrates a cross-sectional representation for the memory cell illustrated in the schematic of FIG. 3, according to various embodiments. The memory cell 400 includes a thyristor 404 that is formed vertically in a trench. A trapping insulator layer 413 is formed vertically along the p−/n− region of the n+/p−/n−/p+ thyristor. The charges introduced into the floating body 407 of the access transistor acts to gate the thyristor 404. Trapping of charges on the trapping layer adds extra margin to the stored data states, prevents their degradation, and renders the cell non-volatile. The p+ anode 409 of the thyristor extends into the p− substrate, also referred to herein as a bulk semiconductor region. Application of Vref to the substrate 409 removes the need to have a dedicated Vref node for each memory cell. The resulting memory cell thus yields into a cross-point memory cell defined by the intersection of the word line and the bit line (while keeping high performance and high stability attributes). The memory cell approaches the ideal 4 $F^2$ density, which is twice as much as that of a conventional DRAM cell without the complexity and scalability concerns of a capacitor used for memory storage. Additionally, the enhanced stability of the memory states when added to the stable switching states of the thyristor eliminates the need of memory refreshing of the conventional DRAM. Furthermore, the improved logic separation of the memory states offers very fast sensing, similar to the sensing speed of SRAM.

Figure 5A:
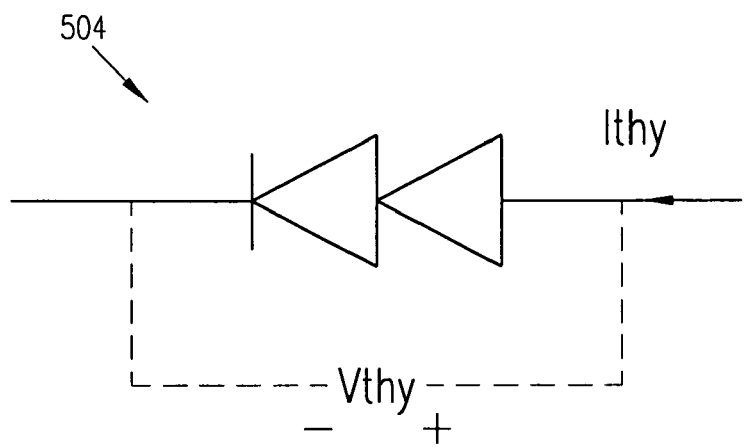
FIGS. 5A-5B illustrate an I-V curve, including logic '0' and logic '1' states, for a thyristor.
Figure 5B:
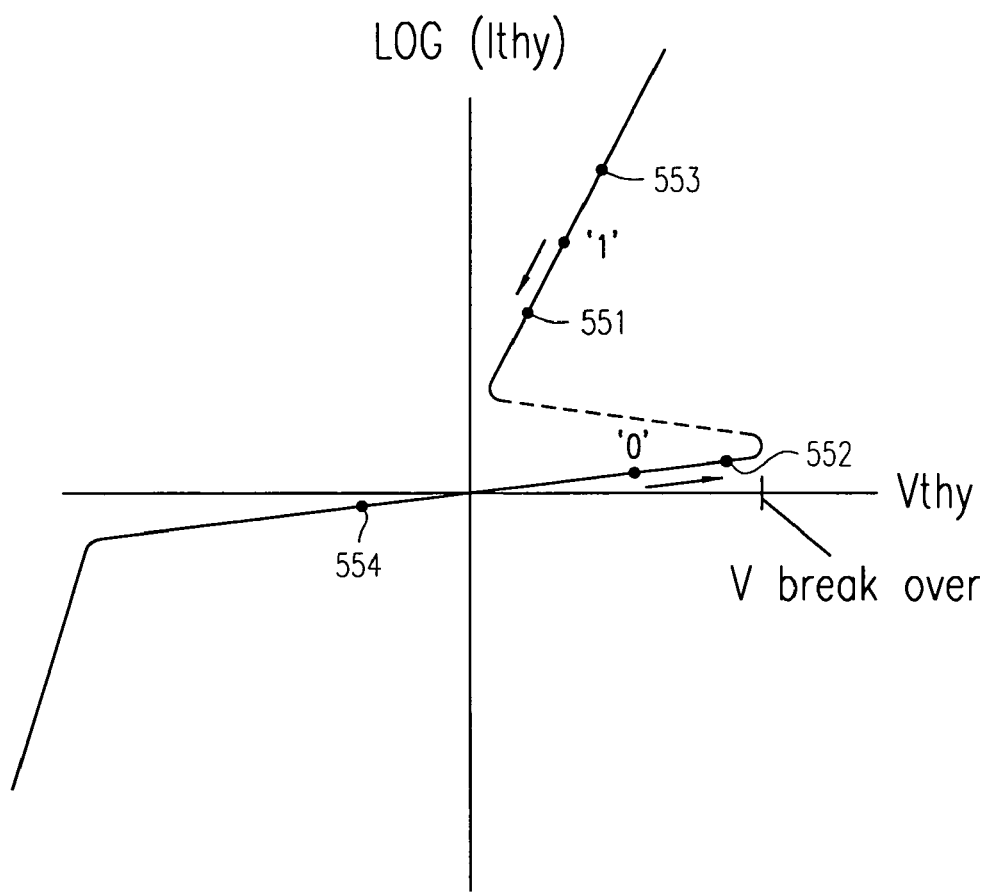

FIGS. 5A-5B illustrate an I-V curve, including assigned logic '0' and logic '1' states, for a thyristor. The thyristor 504 is illustrated in FIG. 5A, and the logic states for the thyristor current (Ithy) and thyristor voltage (Vthy) are illustrated in FIG. 5B. The data or logic states "1" and "0" are not permanently stable for a thyristor. When a logic "1" is stored, a positive potential floats on the storage node by virtue that the junctions surrounding this node are reversed biased. However, with time, the positive potential on the storage node drops due to finite leakage mechanisms such as thermal recombination of holes with electrons across the depletion layer of the reversed biased junctions. Such degradation may occur on the order of tens of milliseconds to seconds. Similarly the logic "0" data state also degrades on the order of tens of milliseconds to seconds as the potential of the storage node rises due to radiation effects and/or ground noise transmissions. The normal standby drifts of the metastable thyristor states are shown as arrows 550 directed toward a normal standby "1" state 551 and to a normal standby "0" state 552. As a result, the margin between memory states is reduced, which affects the integrity of the data states and ultimately affects the performance of the memory device. As such, without the charge trapping insulator, the memory cell is somewhat volatile because the data may be lost when power is removed from the device, and the memory cell may require periodic refreshing to maintain sufficient margin between the data states. Trapping charge in the charge trapping insulator adds extra margin to the stored data states, prevents their degradation and provides a more nonvolatile memory cell. This is shown in FIG. 5B at 553 for the "1" state and 554 for the "0" state.

Figure 6A:
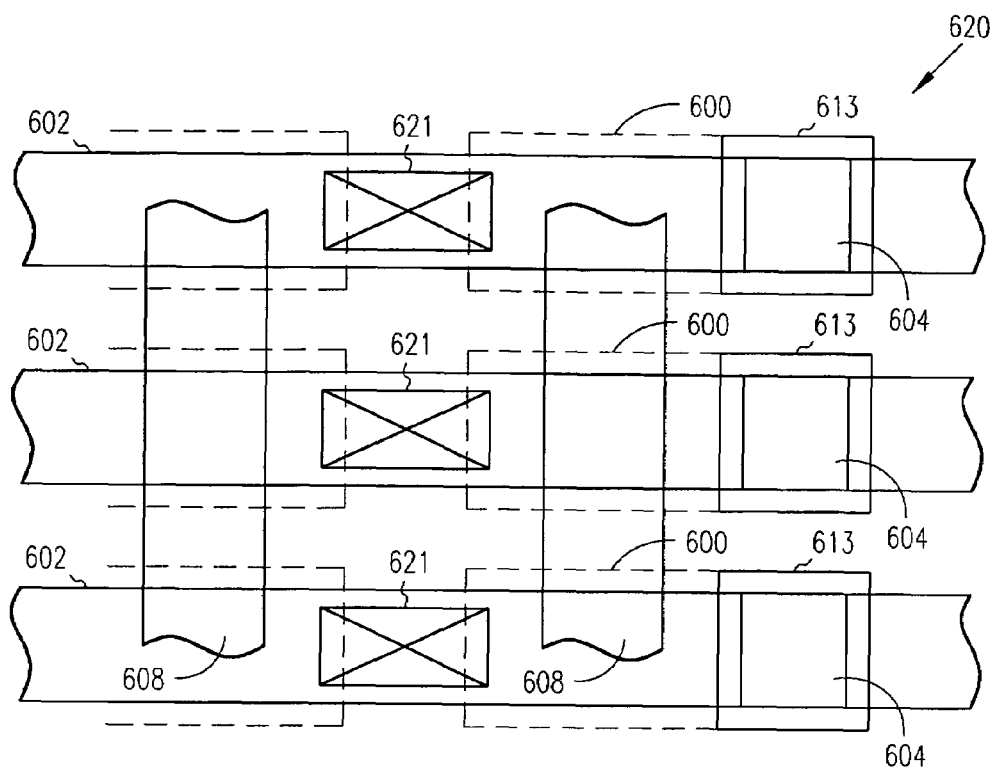
FIGS. 6A-6B illustrate top and cross-sectional view, respectively, of a memory cell layout, according to various embodiments.
Figure 6B:
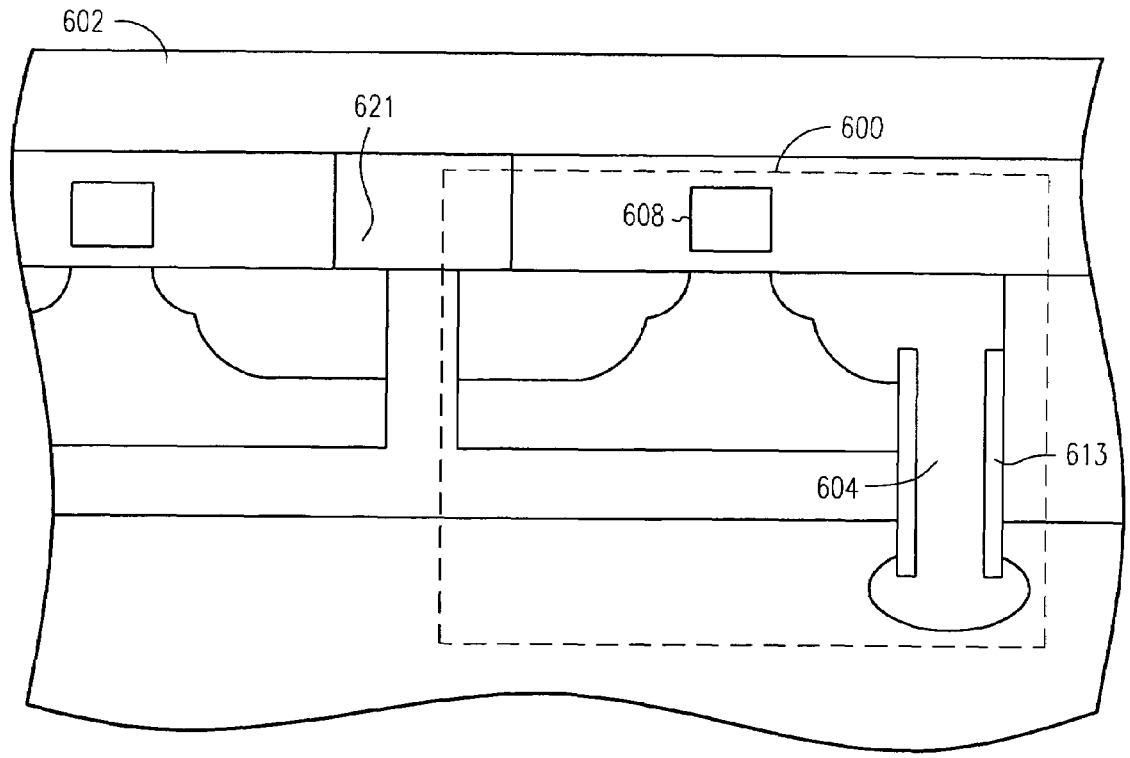

FIGS. 6A-6B illustrate top and cross-sectional view, respectively, of a memory cell layout, according to various embodiments. The illustrated memory cell array shows parallel word lines 608 and parallel bit lines 602 that are orthogonal to the word lines. Memory cells 600 are illustrated by the dotted lines. The illustrated array includes shared bit line contacts, which are shared by two adjacent memory cells. The illustrated array also includes vertical thyristors 604 surrounded by an insulator, at least a portion of which functions as a thyristor gate. According to various embodiments, non-volatile memory cells are provided using a charge trapping insulator around the thyristor gate.

Memory Formation

The memory cell outlined above can be readily fabricated using a standard SOI technology. However, since the cell requires an access transistor on a floating body, this could also be achieved in a bulk technology by creating either a localized buried oxide or by a buried diffusion isolating the p− floating body.

Figure 7:
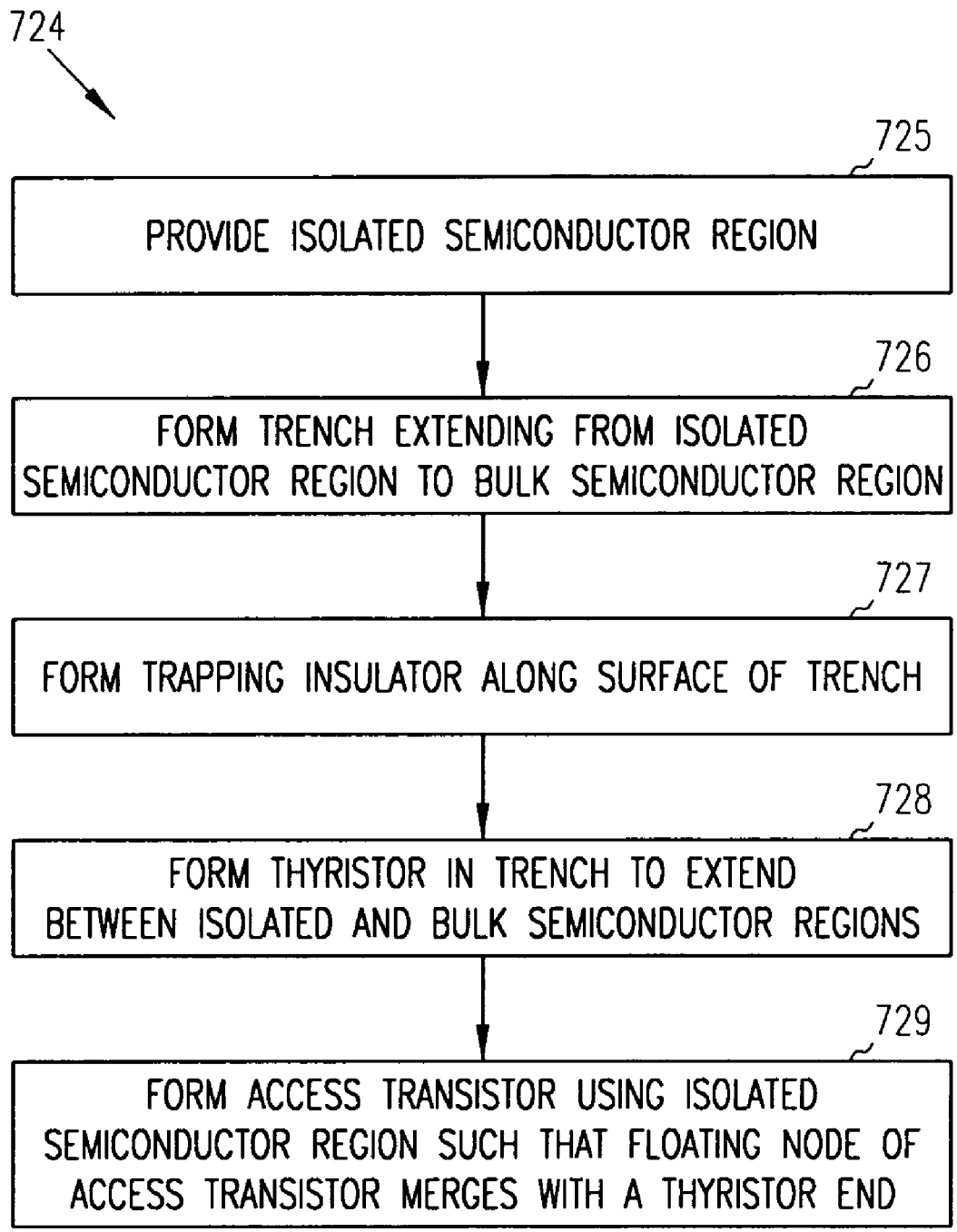
FIG. 7 illustrates a flow diagram of a method for forming a memory cell, according to various embodiments.

FIG. 7 illustrates a flow diagram of a method for forming a memory cell, according to various embodiments. According to various embodiments of the method 724, an isolated semiconductor region separated from a bulk semiconductor region is provided at 725. At 726, a trench is formed that extends from the isolated semiconductor region to the bulk semiconductor region. At 727, a charge trapping insulator is formed along a surface of the trench. In various embodiments of the memory cell without the enhanced stability provided by the charge trapping, an insulator is formed at 727 in lieu of a charge trapping insulator. At 728, a thyristor is formed in the trench to extend between the isolated semiconductor region and the bulk semiconductor region. At 729, an access transistor is formed using the isolated semiconductor region. First and second diffusion regions of the access transistor are formed in the isolated semiconductor region, and the second diffusion region is merged with a thyristor end and functions as a floating node.

Figure 8:
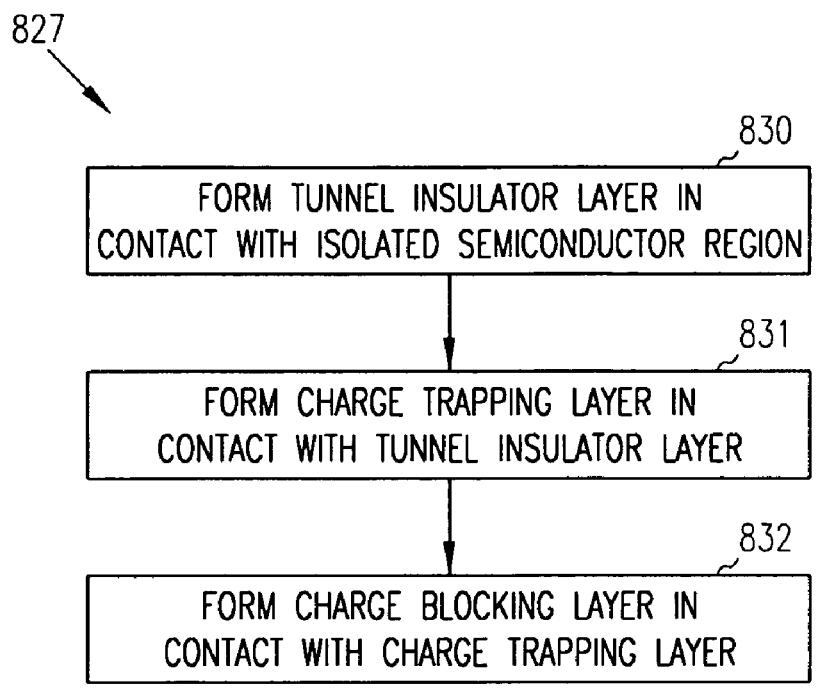
FIGS. 8 and 9 illustrate a flow diagram of a method for forming a trapping insulator, according to various embodiments.
Figure 9:
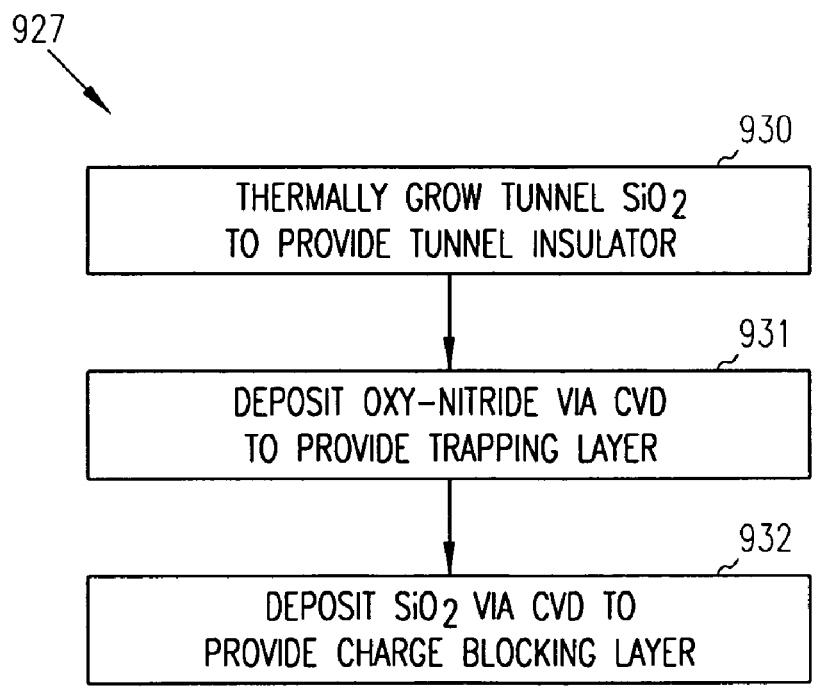

FIGS. 8 and 9 illustrate a flow diagram of a method for forming a trapping insulator, according to various embodiments. The method 827 illustrated in FIG. 8 and the method 927 illustrated in FIG. 9 generally correspond to 727 in FIG. 7. At 830, a tunnel insulator layer is formed within the trench to be in contact with the isolated semiconductor region. At 831, a charge trapping layer is formed within the trench to be in contact with the tunnel insulator layer. At 832, a charge blocking layer is formed to be in contact with the charge trapping layer. FIG. 9 illustrates a method to provide a thyristor gate insulator with a oxide/oxy-nitride/oxide insulator. At 930, the tunnel insulator is provided by thermally growing tunnel oxide ($SiO_2$). At 931, the charge trapping layer is provided by depositing oxy-nitride ($S_xO_yN_z$) via a chemical vapor deposition (CVD) process. The composition of the oxy-nitride is capable of being tailored to provide a high density of charge traps at a desired depth. At 932, the charge blocking layer is provided by depositing either oxide ($SiO_2$) via CVD or a second layer of oxygen-rich oxy-nitride. The composition of the oxide/oxy-nitride is capable of being tailored to provide the desired characteristics to block charge from the thyristor. In various embodiments, both the tunnel layer oxide and charge blocking layer oxide are deposited using CVD.

According to various embodiments, the depth of the trench is approximately 3,000 to 4,000 Å to extend through the BOX region that has a depth on the order of a couple of thousand angstroms. The isolated semiconductor region, which forms the active region of the semiconductor on insulator (SOI) device, has a depth of approximately 1,000 Å. According to various embodiments, the thermally-grown oxide is approximately 30 to 60 Å thick, the charge trapping oxy-nitride layer deposited by CVD is approximately 60 Å thick, and the charge blocking oxide deposited by CVD is approximately 100 Å thick, depending on the operating voltage.

Other charge trapping insulators can function as the thyristor gate insulator. According to various embodiments, for example, the charge trapping insulator includes an oxide/nitride/oxy-nitride (ONO) structure, where charge is trapped in the nitride of the ONO structure. The oxide of the charge blocking layer is thicker than the oxide of the tunnel layer. Oxy-nitride is capable of providing deeper charge traps and charge traps that have a tailorable depth for a desired cell design at desired operating voltages.

In various embodiments, the charge trapping layer includes silicon rich nitride (SRN). In various embodiments, the charge trapping layer includes silicon rich oxide (SRO). In various embodiments, the charge trapping layer includes a plurality of distinct metal volumes (also referred to as "metal dots") surrounded by a dielectric material. These metal volumes can include platinum (Pt), gold (Au), and tungsten (W). The dielectric material surrounding the metal volumes can include aluminum oxide ($Al_2O_3$), silicon dioxide ($SiO_2$), zirconium oxide ($ZrO_2$), and hafnium oxide ($HfO_2$). The metal and dielectric are chosen to provide the desired charge trapping insulator characteristics for a given cell design.

In various embodiments, the tunnel layer, the charge trapping layer, and the charge blocking layer include silicon oxy-nitride ($Si_xO_yN_z$). The composition of the oxy-nitride is capable of being tailored using CVD to provide the desired characteristics. Oxide has a refractive index of approximately 1.4, nitride has a refractive index of about 2.0, and silicon oxy-nitride ($Si_xO_yN_z$) has a refractive index within a range of approximately 1.4 to 2.0 depending on its composition. According to various embodiments, the charge trapping layer includes silicon oxy-nitride ($Si_xO_yN_z$) with a refractive index within a range of about 1.75 to about 1.9. According to various embodiments, the tunnel layer includes silicon oxy-nitride ($Si_xO_yN_z$) with a refractive index within a range of about 1.5 to about 1.6. In various embodiments, the charge blocking layer could be a high K dielectric such as aluminum oxide ($Al_2O_3$) or zirconium oxide ($ZrO_2$) deposited by CVD or by atomic layer deposition (ALD) techniques.

Figure 10A:
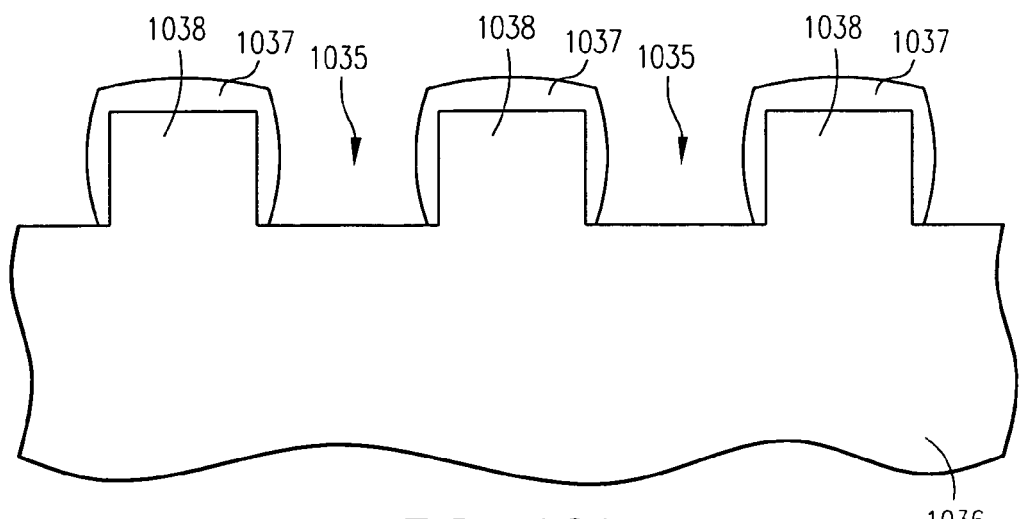
FIGS. 10A-10C illustrate a selective-oxidation method for providing isolated semiconductor regions, according to various embodiments.
Figure 10B:
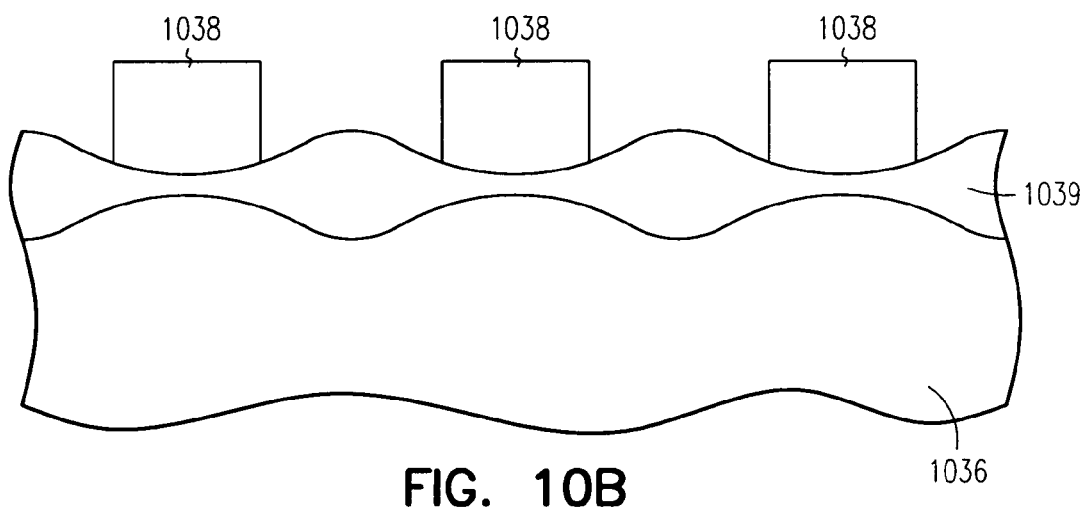
Figure 10C:
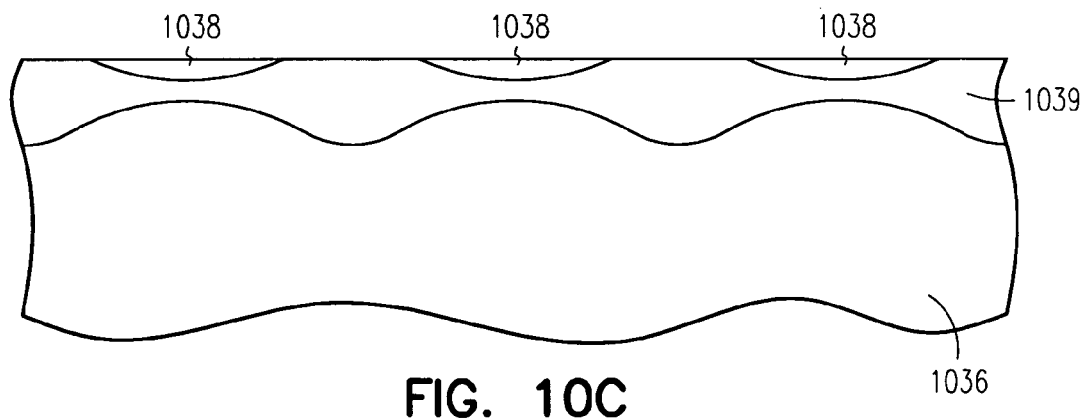

FIGS. 10A-10C illustrate a selective-oxidation method for providing isolated semiconductor regions, according to various embodiments. In this embodiment, isolated semiconductor regions are formed in bulk silicon. Trenches 1035 are formed in the silicon 1036. An oxidation protection layer 1037 is formed over pillars 1038. A selective oxidation process is performed such that oxide ($SiO_2$) 1039 is formed beneath the pillars 1038. The structure is planarized to form the structure illustrated in FIG. 10C. The remaining portion 1038 of the pillars forms the isolated semiconductor region, such as illustrated at 215 in FIG. 2, for example.

Figure 11A:
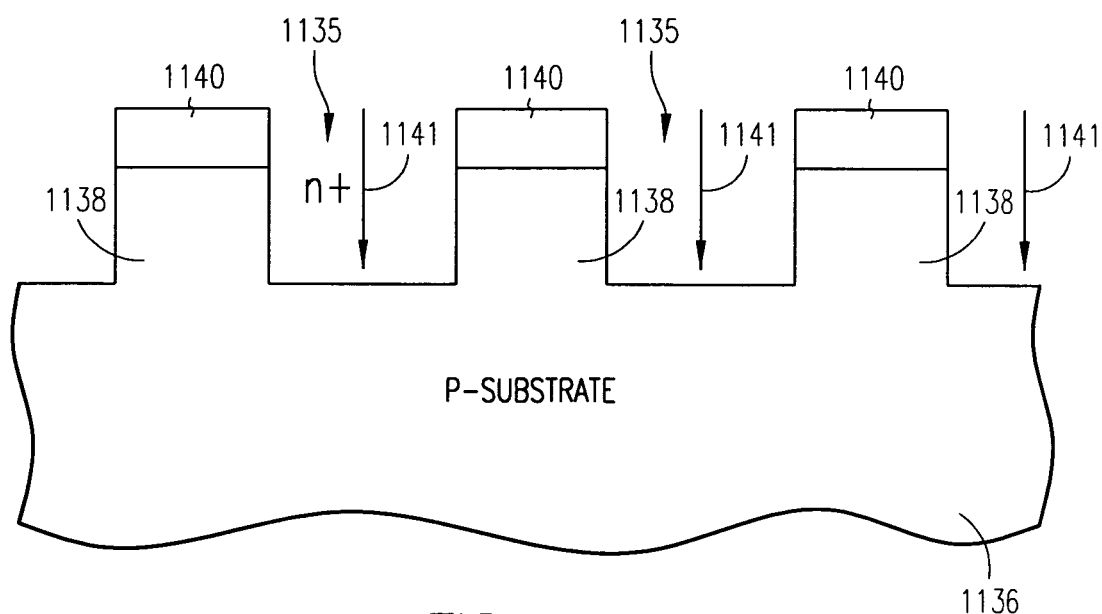
FIGS. 11A-11B illustrate an ion-implantation method for providing isolated semiconductor regions, according to various embodiments.
Figure 11B:
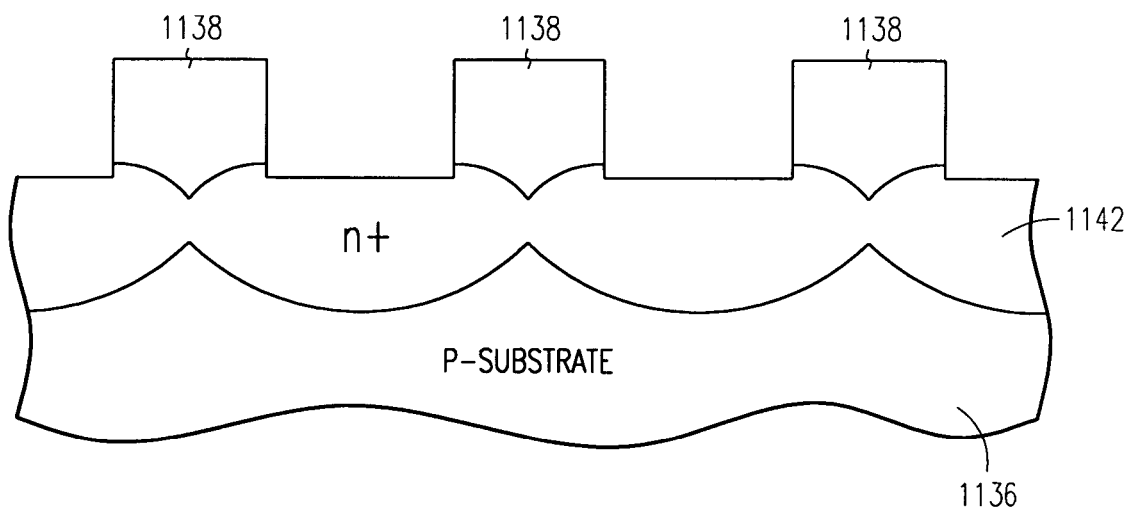

FIGS. 11A-11B illustrate an ion-implantation method for providing isolated semiconductor regions, according to various embodiments. In this embodiment, isolated semiconductor regions are formed in bulk silicon. An ion implant mask 1140 is formed on the structure, and trenches 1135 are formed in the silicon 1136 to form silicon pillars 1138. An ion implant process is performed, as illustrated by arrows 1141. For example, n+ ions are implanted into a p− substrate. The mask is removed, and the structure is annealed to diffuse the n+ region 1142 and form the buried diffusion beneath the pillars 1138 to isolate the pillars and form the isolated semiconductor region, such as illustrated at 215 in FIG. 2, for example.

FIGS. 12A-12H illustrate a method for forming a memory cell, according to various embodiments, using Semiconductor-On-Insulator (SOI) technology. The illustrated SOI wafer includes a bulk region 1210, a buried oxide (BOX) region, and a p− active region 1244 isolated from the bulk region 1210 by the BOX region. A shallow trench isolation (STI) process is performed to form STI regions 1245 in the active region 1244 and provide an isolated semiconductor region 1215, such as illustrated at 215 in FIG. 2, for example.

Figure 12A:
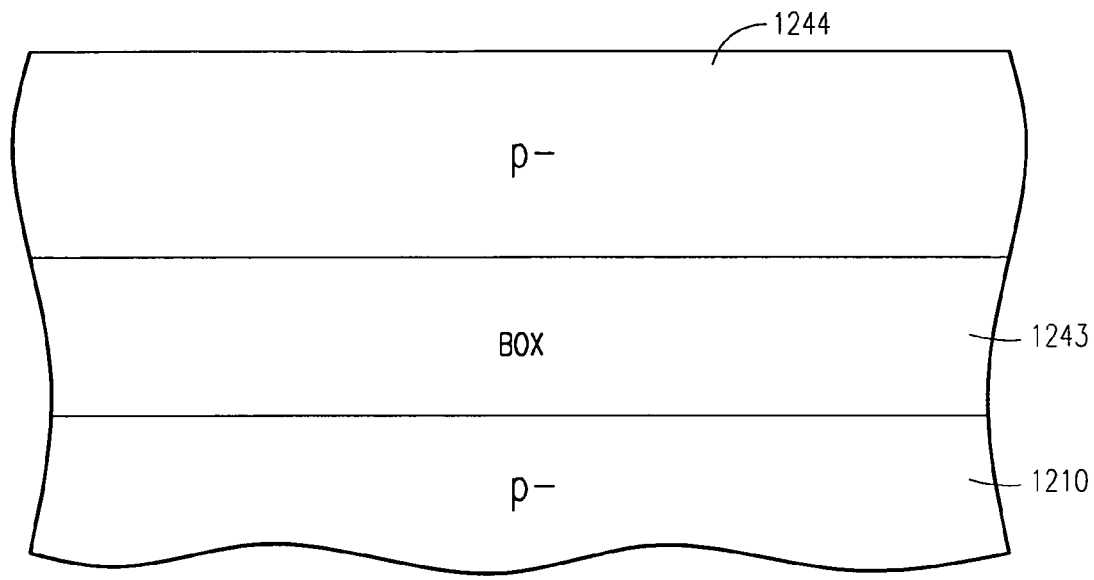
FIGS. 12A-12H illustrate a method for forming a memory cell, according to various embodiments, using Semiconductor-On-Insulator (SOI) technology.
Figure 12B:
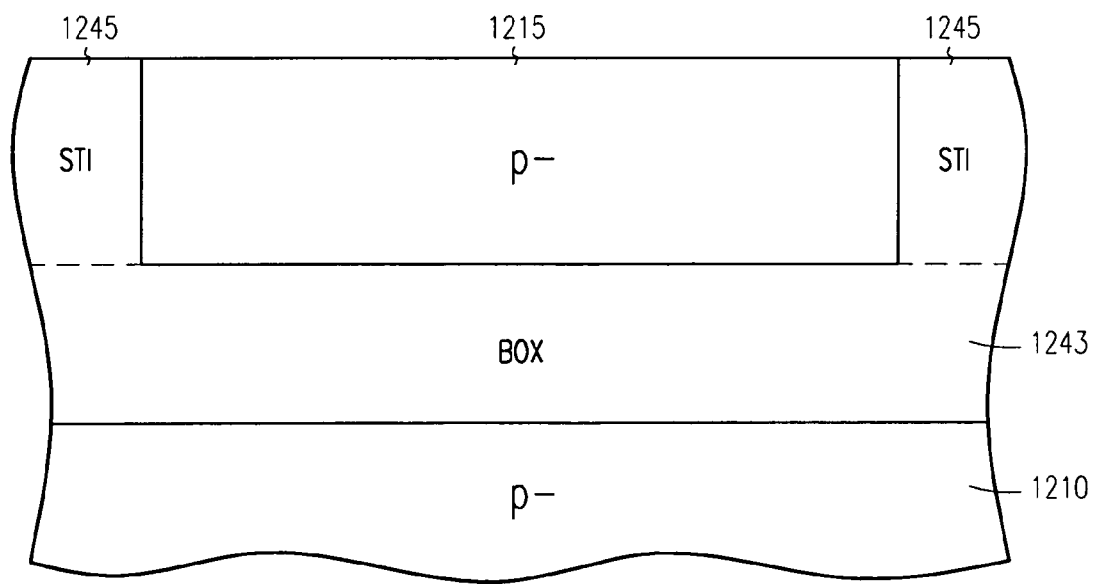
Figure 12C:
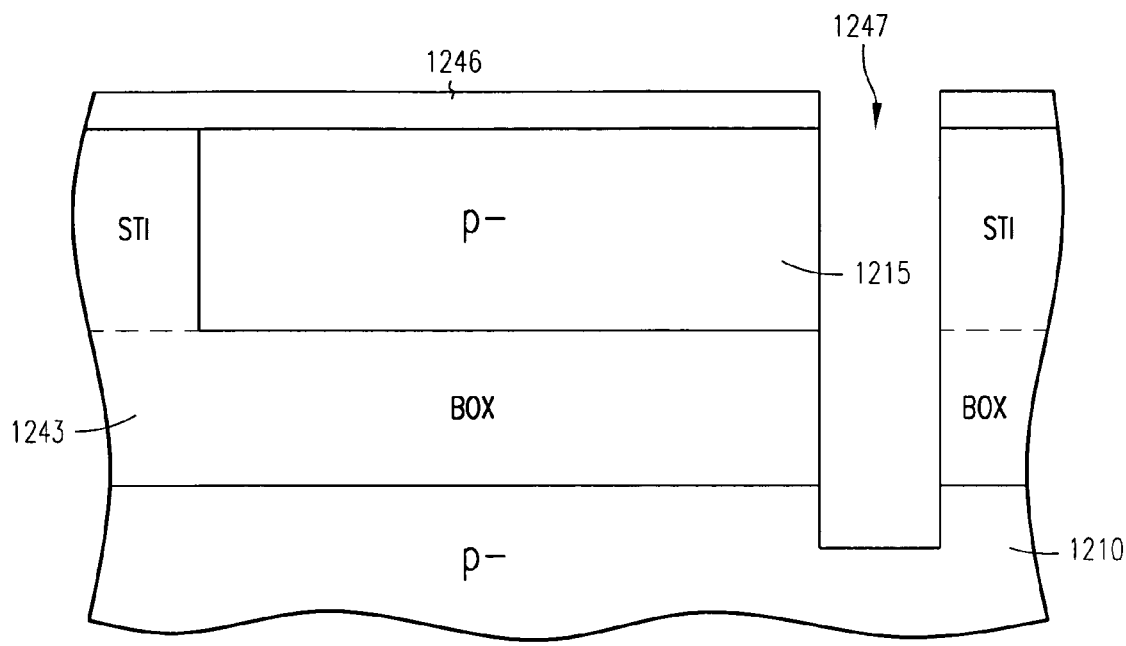
Figure 12D:
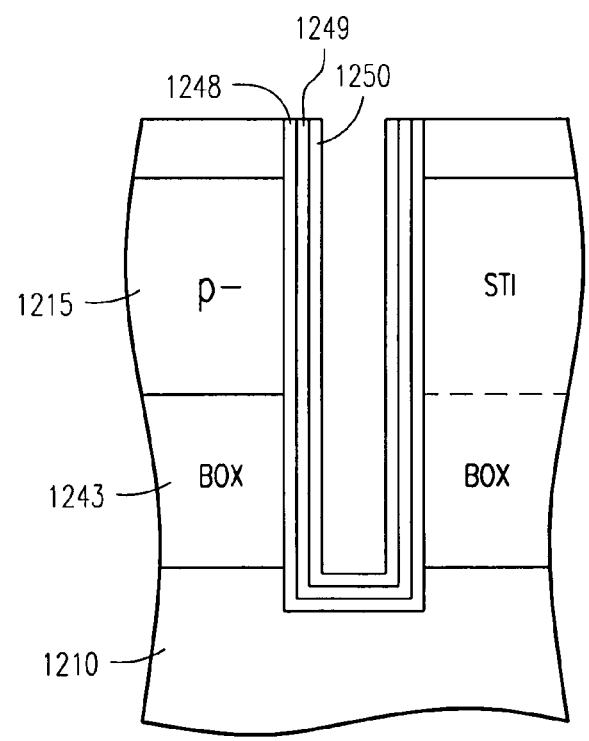
Figure 12E:
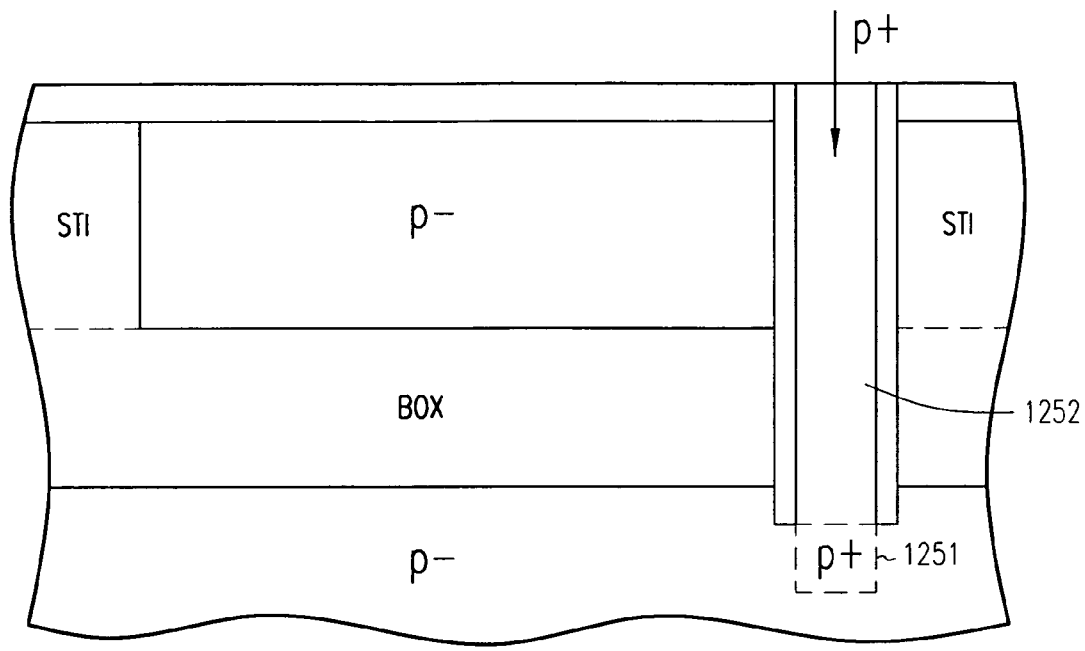
Figure 12F:
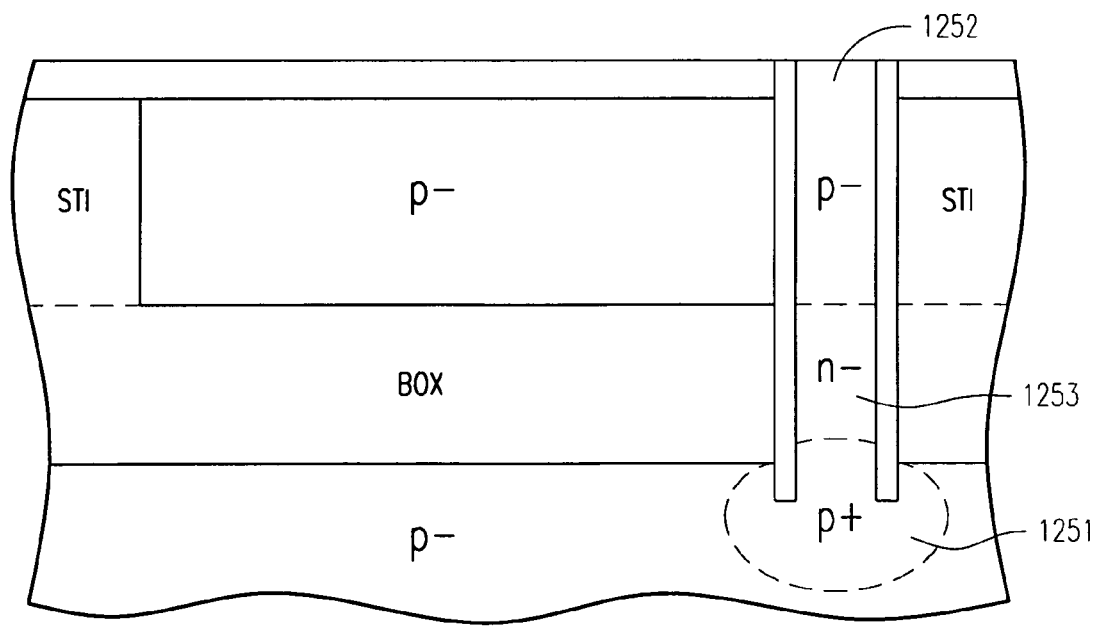
Figure 12G:
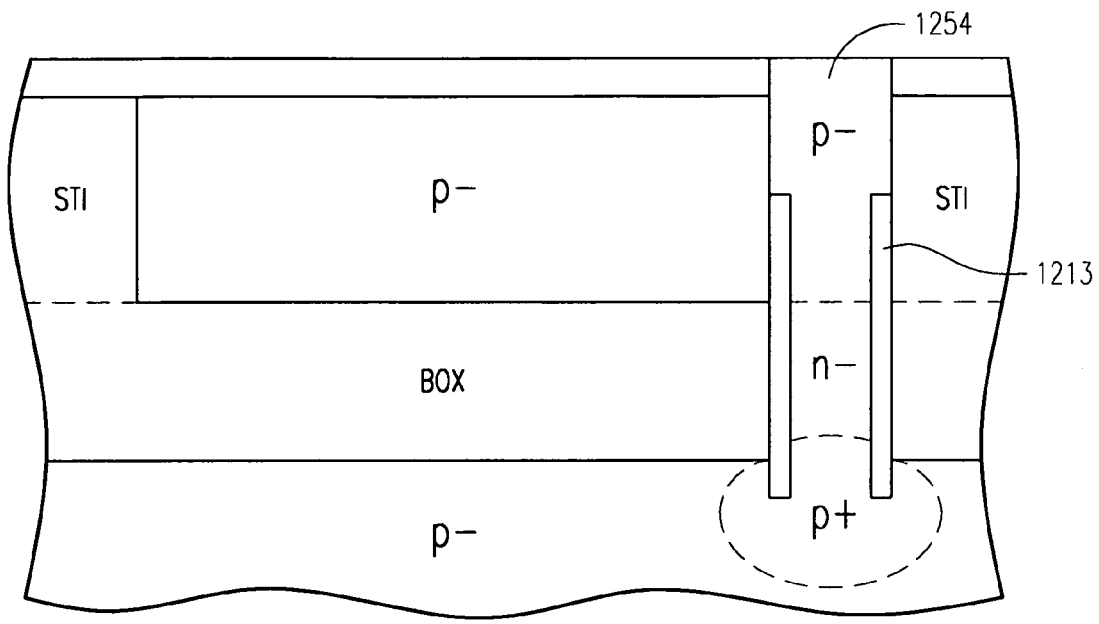
Figure 12H:
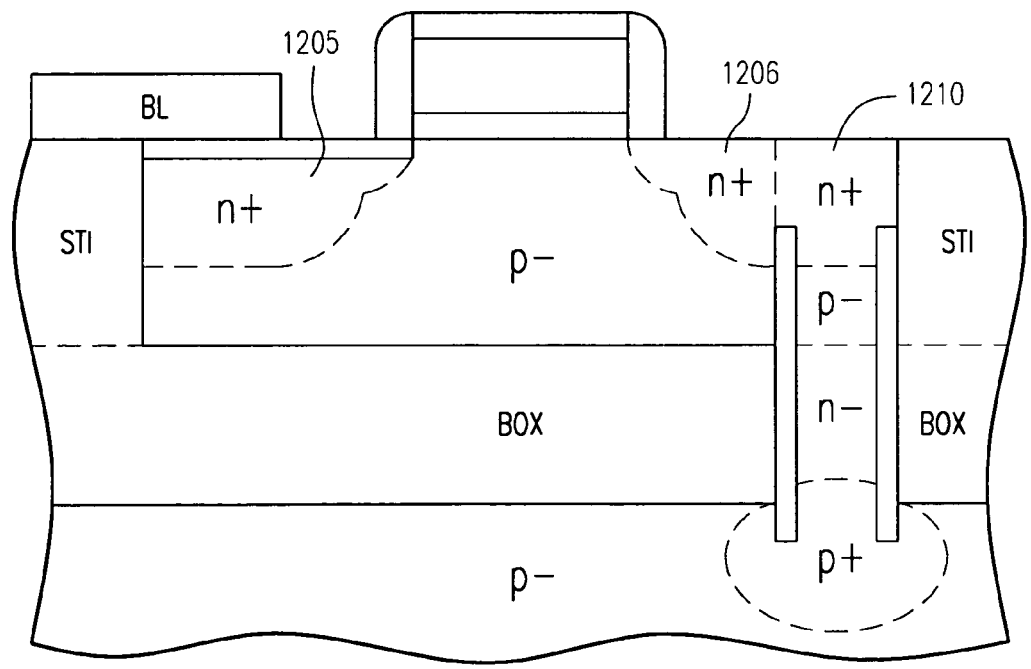

Referring to FIG. 12C, a mask 1246 is defined and formed on the structure, and a trench 1247 is formed through the BOX region 1243 and into the bulk semiconductor region 1210. FIG. 12D illustrates the formation of the thyristor gate insulator, and particularly a charge trapping insulator, along the side walls and bottom of the trench 1247. Various embodiments provide thermally grown oxide as a tunnel layer 1248, oxy-nitride as a charge trapping layer 1249, and oxide deposited by CVD as a charge blocking layer 1250. As illustrated in FIG. 12E, a p+ implant (e.g. boron) is performed through the oxide on the bottom of the trench to form a p+ anode region within the p− bulk semiconductor region 1210. The p+ region diffuses upon subsequent annealing. P− semiconductor 1252 is epitaxially grown. As illustrated in FIG. 12F, an n type ion (e.g. phosphorous) is implanted to counter dope the n− region. Alternatively, as is understood by those skilled in the art upon reading and comprehending this disclosure, an n− semiconductor can be epitaxially grown and counter doped with a p type ion (e.g. boron) implant. In FIG. 12G, the charge trapping insulator 1213 (1248, 1249, 1250 in FIG. 12D) is etched away, and p− semiconductor is epitaxially re-grown. In FIG. 12H, the gate oxide, gate, and side spacers are formed, and the n+ diffusion regions 1205 and 1206 of the access transistor are formed along with the n+ region 1210 of the thyristor.

Cell Operation

Figure 13:
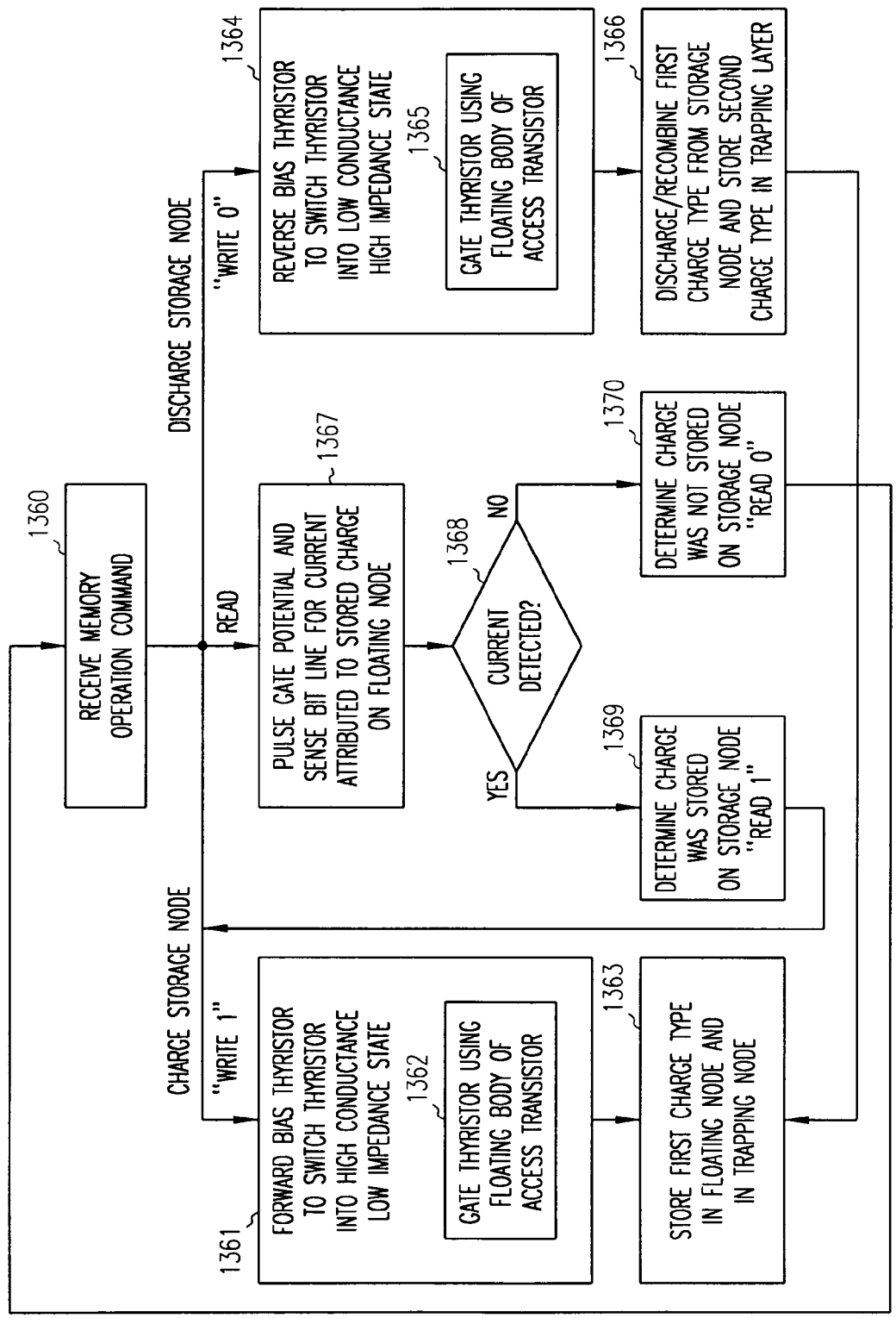
FIG. 13 illustrates a method for operating a memory cell, according to various embodiments.

FIG. 13 illustrates a method for operating a memory cell, according to various embodiments. At 1360, a memory operation command is received. The memory commands include a "write 1" command to charge the storage node (e.g. charge the storage node of an n-channel access transistor with holes), a "write 0" command to discharge or recombine the charge on the storage node, and a read command to determine whether charge is stored in the storage node.

In response to receiving a command to charge a storage node of the memory cell, the process proceeds to 1361 where a thyristor is forward biased to switch the thyristor into a high conductance low impedance state, which includes gating the thyristor using a floating body of an access transistor that is capacitively coupled to a gate of the access transistor, as represented at 1362. Gating the thyristor includes pulsing the gate of the access transistor. At 1363, a first charge type is stored in the storage node and in a trapping insulator that separates the floating body of the access transistor from the thyristor.

In response to receiving a command to discharge the storage node of the memory cell, the process proceeds to 1364 where the thyristor is reverse biased to switch the thyristor into a low conductance high impedance state, which includes gating the thyristor using the floating body of the access transistor, as represented at 1365. Gating the thyristor includes pulsing the gate of the access transistor. At 1366, the first charge type is discharged from the storage node and a second charge type is stored in the trapping insulator.

In response to receiving a read command, the process proceeds to 1367 where the gate of the access transistor is pulsed and a bit line is sensed for current attributed to stored charge on the storage node of the access transistor. At 1368, it is determined if current is detected. If current is detected, the process proceeds to 1369 where it is determined that charge was stored on the storage node, and further proceeds to 1361 to restore charge on the storage node that was lost during the read process. If current is not detected, the process proceeds to 1370 where it is determined that charge was not stored on the storage node.

Figure 14:
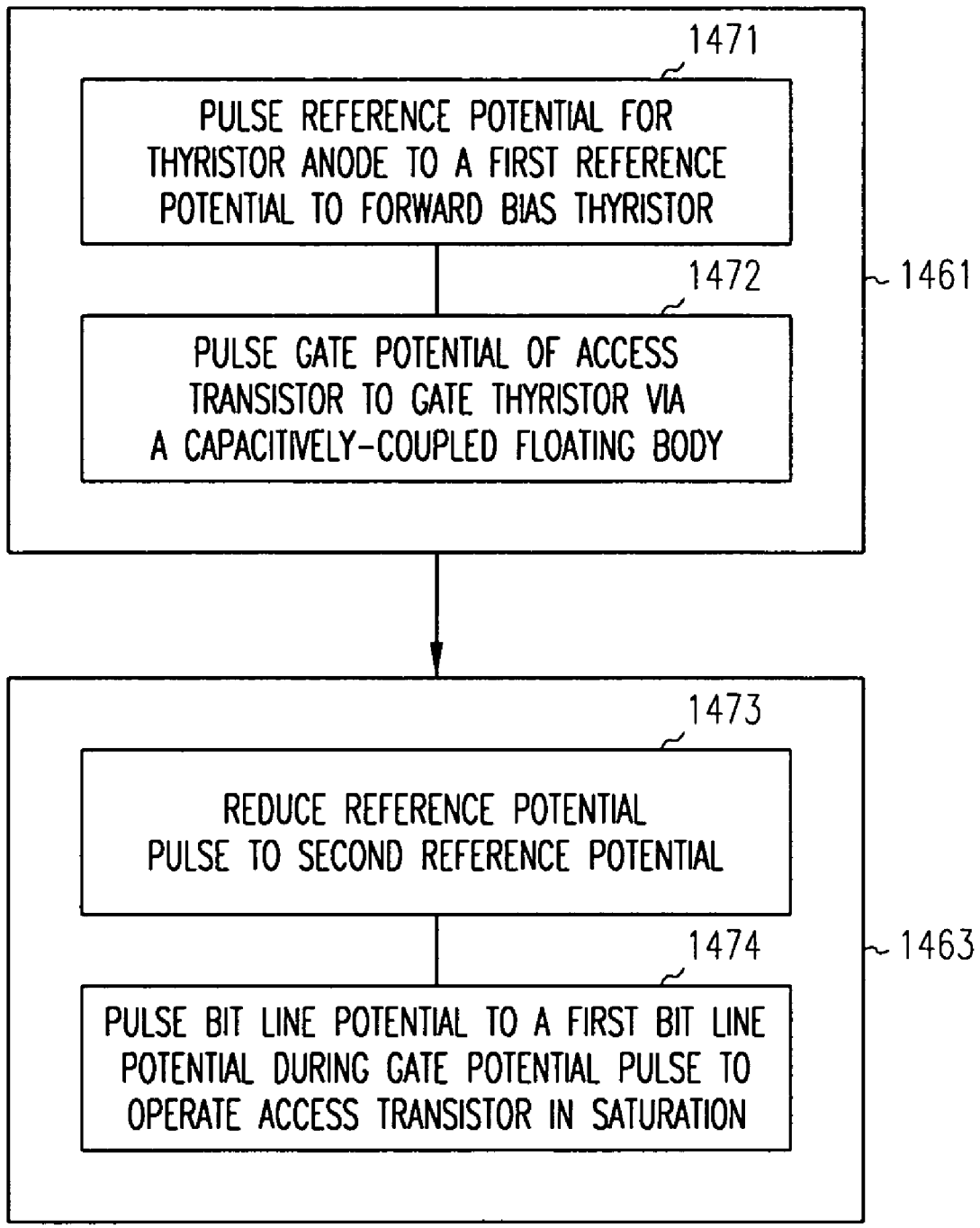
FIG. 14 illustrates a method for charging a storage node of a memory cell, according to various embodiments.

FIG. 14 illustrates a method for charging a storage node of a memory cell, according to various embodiments. Forward biasing a thyristor to switch the thyristor into a high conductance low impedance state is represented at 1461, and generally corresponds to 1361 in FIG. 13. Storing a first charge type in the storage node and in a trapping insulator is represented at 1463, and generally corresponds to 1363 in FIG. 13. Forward biasing the thyristor at 1461 includes pulsing a reference potential for a thyristor anode to a first reference potential to forward bias the thyristor at 1471, and pulsing a potential of the gate of the access transistor to gate the thyristor via the capacitively-coupled floating body at 1472. Storing a first charge type at 1463 includes reducing the reference potential pulse to a second reference potential at 1473, and pulsing a bit line potential to a first bit line potential during the gate potential pulse to operate the access transistor in saturation such that the generated charge is stored in the trapping layer at 1474.

Figure 15:
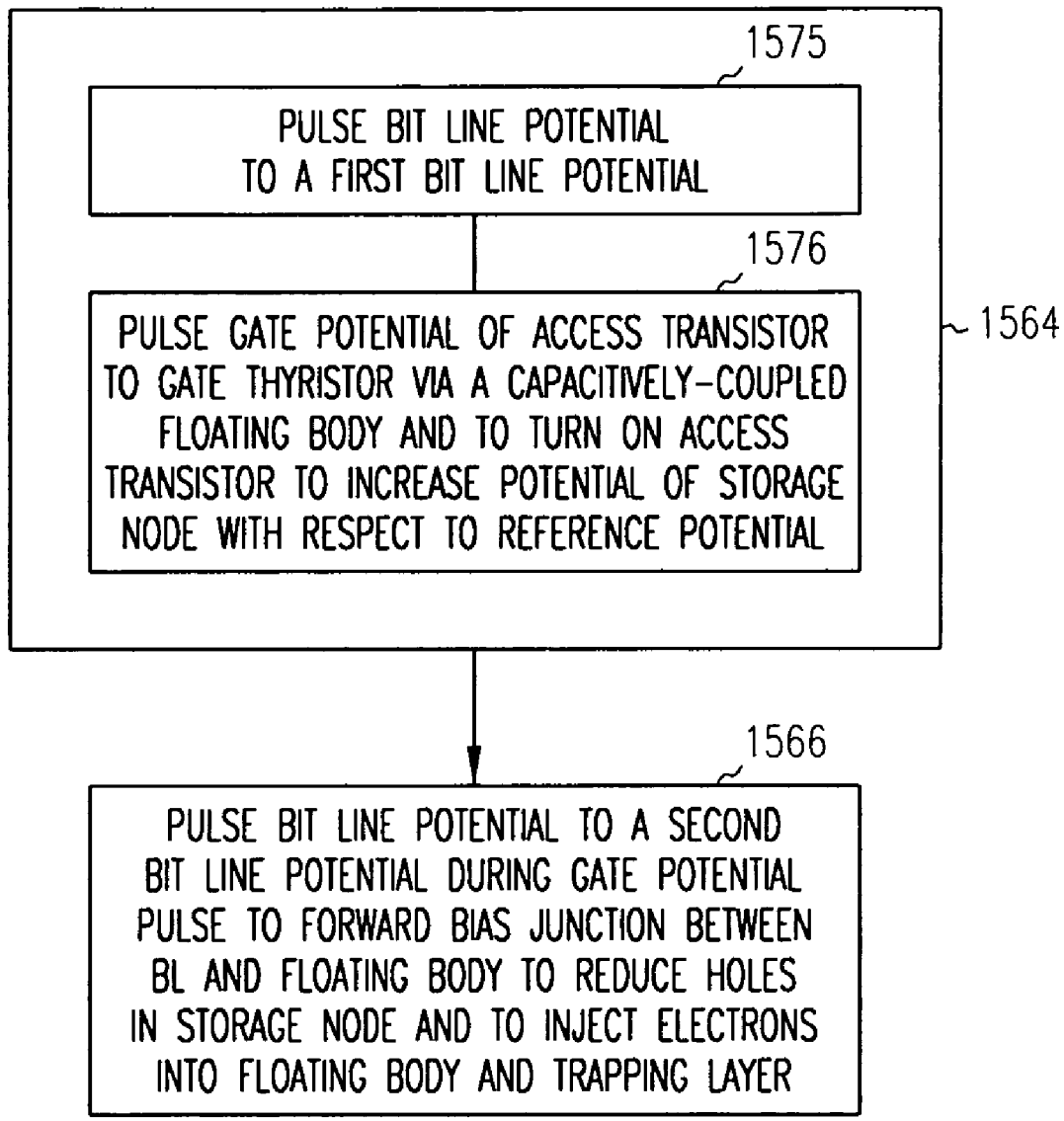
FIG. 15 illustrates a method for discharging a storage node of a memory cell, according to various embodiments.

FIG. 15 illustrates a method for discharging a storage node of a memory cell, according to various embodiments. Reverse biasing the thyristor is generally represented at 1564, and generally corresponds to 1364 in FIG. 13. Discharging the first charge type is generally represented at 1566, and generally corresponds to 1366 in FIG. 13. Reverse biasing the thyristor to switch the thyristor into a low conductance high impedance state and discharging the first charge type from the storage node and storing a second charge type in the trapping insulator, as represented at 1564, includes pulsing the bit line potential to the first bit line potential at 1575, and pulsing the potential of the gate of the access transistor to gate the thyristor via a capacitively-coupled floating body and to turn on the access transistor to increase the potential of the storage node with respect to the reference potential at 1576. Discharging the first charge type, as represented at 1566, includes pulsing the bit line potential to a second bit line potential during the gate potential pulse to forward bias a junction between the bit line and the floating body to reduce holes in the storage node and to inject electrons into the floating body and the trapping layer.

Figure 16:
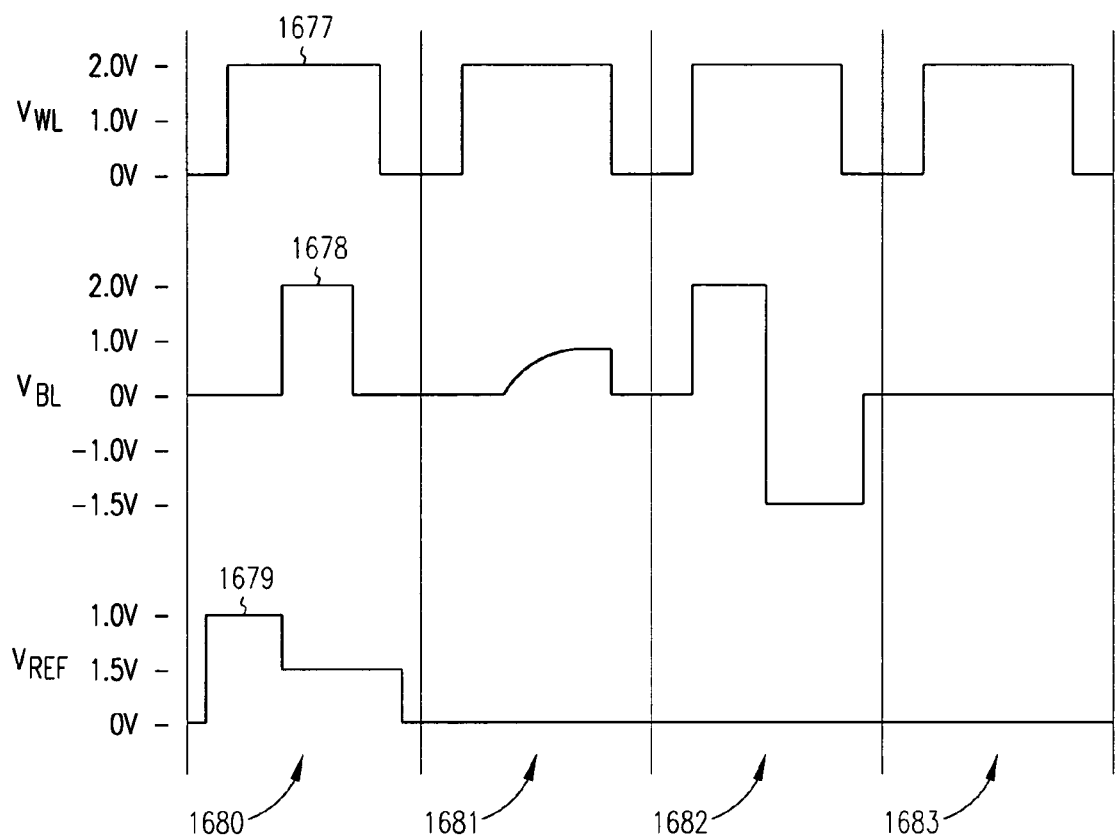
FIG. 16 illustrates waveforms for a word line potential, a bit line potential and a reference line potential during read and write operations performed on the memory cell, according to various embodiments.

FIG. 16 illustrates waveforms for a word line potential 1677, a bit line potential 1678 and a reference line potential 1679 during read and write operations performed on the memory cell, according to various embodiments. The NDR effects of the thyristor is used to achieve the two stable memory states. The memory states are defined as "zero" for the low conduction high impedance OFF state of the thyristor, and "one" for the high conduction low impedance ON state of the thyristor. Those of ordinary skill in the art will understand that the logical state names can be changed. As represented at 1680, writing or storing "one" implies raising the potential of the floating n+ node by putting positive charge into the node; and as represented at 1681, subsequently sensing ("read one") the transfer of the stored positive charges to the floating bit line. As represented at 1682, writing or storing "zero" implies discharging the potential of the floating n− node to zero so that bit line potential remains unchanged ("read zero") on subsequent sensing, as represented at 1683. To write "one" (1680) to the device, the thyristor is forward biased by raising the reference potential sufficiently positive and subsequently pulsing the word line to Vdd. As the word line is pulsed high, the floating body capacitively couples and gates the thyristor turning the thyristor in the high conduction mode. Bit line is subsequently pulsed up, putting the access transistor into saturation and raising the potential of the floating node to Vdd−(Vt+Vref). Thus, "one" is stored into the device. During this process, excess holes are generated in the floating body and gets trapped into the trapping layer. The effect of the trapped positive charge, during standby, is to compensate any loss of positive charge of the floating node due to recombination effects, thus enhancing the stability of the storage "one" state. To write "zero" (1682) to the device, Vref is held to ground, bit line is pulsed up followed by the word line so that the access transistor conducts and discharges the floating node. The thyristor is switched to reverse bias and as before, the word line pulse capacitively couples the floating body and gates the thyristor to increase the speed to turn off the thyristor. Subsequently, the bit line is pulsed negative to forward bias the n+/p diode of the access transistor and to inject excess negative charge into the floating body. The negative charging of the trapping layer has the effect of maintaining the thyristor as well as the n+/p− junction strongly reversed-biased, during standby, enhancing the stability of the "zero" state.

System Level

Figure 17:
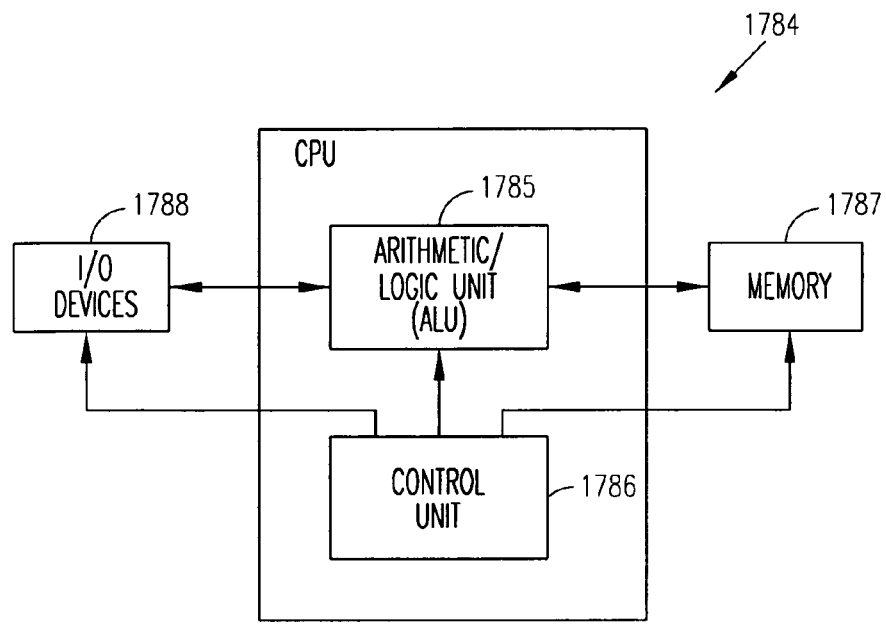
FIG. 17 illustrates a simplified block diagram of a high-level organization of an electronic system that includes a memory cell with a trenched gated thyristor, according to various embodiments.

FIG. 17 illustrates a simplified block diagram of a high-level organization of an electronic system that includes a memory cell with a trenched gated thyristor, according to various embodiments. In various embodiments, the system 1784 is a computer system, a process control system or other system that employs a processor and associated memory. The electronic system 1784 has functional elements, including a processor or arithmetic/logic unit (ALU) 1785, a control unit 1786, a memory device unit 1787 and an input/output (I/O) device 1788. Generally such an electronic system 1784 will have a native set of instructions that specify operations to be performed on data by the processor 1785 and other interactions between the processor 1785, the memory device unit 1787 and the I/O devices 1788. The control unit 1786 coordinates all operations of the processor 1785, the memory device 1787 and the I/O devices 1788 by continuously cycling through a set of operations that cause instructions to be fetched from the memory device 1787 and executed. According to various embodiments, the memory device 1787 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a memory cell with a trenched gated thyristor in accordance with the present subject matter. Further, the trenched gated thyristor is capable of bridging conventional RAM and ROM applications because of its high density, nonvolatility and high performance characteristics.

Figure 18:
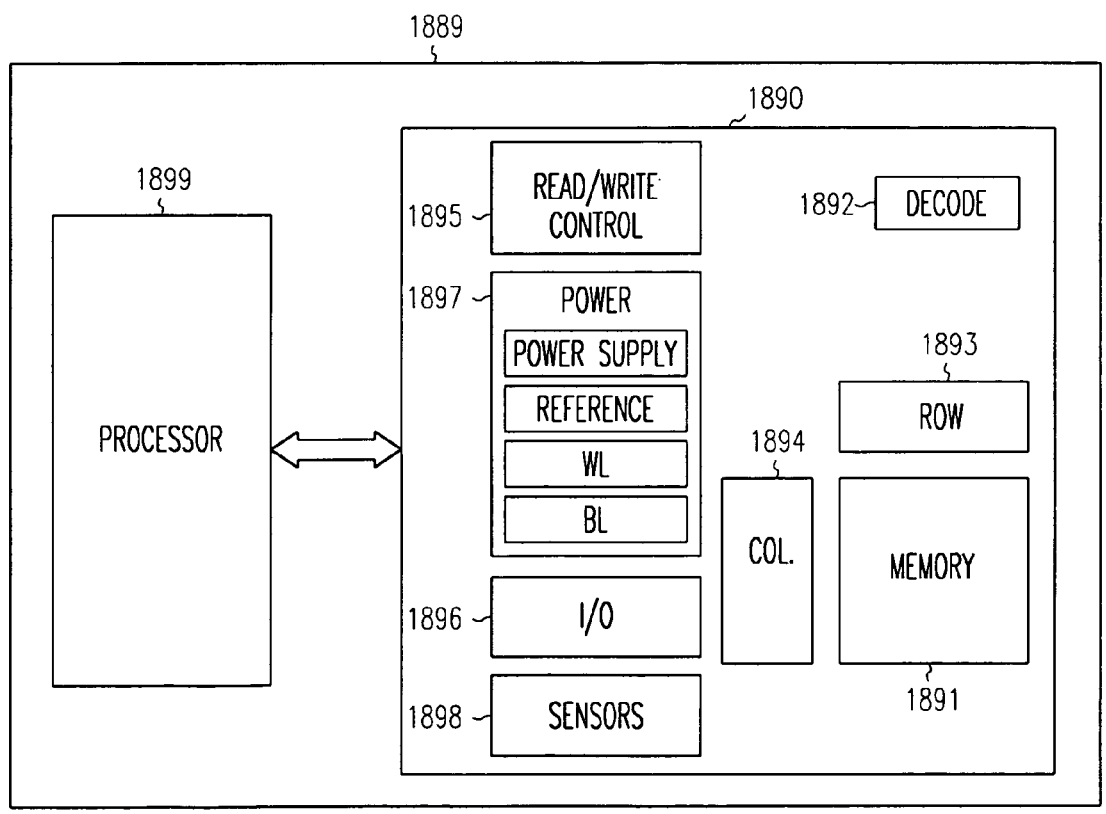
FIG. 18 illustrates a simplified block diagram of a high-level organization of an electronic system that includes a memory cell with a trenched gated thyristor, according to various embodiments.

FIG. 18 illustrates a simplified block diagram of a high-level organization of an electronic system that includes a memory cell with a trenched gated thyristor, according to various embodiments. The system 1889 includes a memory device 1890 which has an array of memory cells 1891, address decoder 1892, row access circuitry 1893, column access circuitry 1894, read/write control circuitry 1895 for controlling operations, and input/output circuitry 1896. The memory device 1890 further includes power circuitry 1897, and sensors 1898 such as current sensors for determining whether a memory cell is discharging a current on a bit line during a read operation. The illustrated power circuitry 1897 includes power supply circuitry, circuitry for providing a reference voltage, circuitry for providing the word line with pulses, and circuitry for providing the bit line with pulses. Also, as shown in FIG. 18, the system 1889 includes a processor 1899, or memory controller for memory accessing. The memory device receives control signals from the processor over wiring or metallization lines. The memory device is used to store data which is accessed via I/O lines. It will be appreciated by those skilled in the art that additional circuitry and control signals can be provided, and that the memory device has been simplified to help focus on the invention. At least one of the processor or memory device includes the memory cell with a trenched gated thyristor according to the present subject matter.

The illustration of system, as shown in FIG. 18, is intended to provide a general understanding of one application for the structure and circuitry of the present subject matter, and is not intended to serve as a complete description of all the elements and features of an electronic system using memory cells with trenched gated thyristors according to the present subject matter. As one of ordinary skill in the art will understand, such an electronic system can be fabricated in single-package processing units, or even on a single semiconductor chip, in order to reduce the communication time between the processor and the memory device.

Applications containing memory cells with trenched gated thyristors, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The disclosed memory cells with trenched gated thyristors possess a number of beneficial characteristics. These cells form cross-point memory cells that provide high performance, high density and low standby power. These cells are compatible with both bulk and SOI silicon technology, are significantly denser than a standard DRAM cell, and are scalable with lithography generations. The gated thyristor has fast turn-off characteristics, and therefore provides fast switching speed. The floating body charges of access transistor enhance storage state stability and cell performance. These memory cells bridge applications of conventional DRAMS and SRAMs, and provide a low cost high performance memory technology compatible to system on-chip applications.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for operating a memory cell, comprising:
charging a storage node of the memory cell, including forward biasing a thyristor to switch the thyristor into a high conductance low impedance state, and storing a first charge type in the storage node and storing the first charge type in a trapping insulator separating a floating body of an access transistor from the thyristor; and
discharging the storage node of the memory cell, including reverse biasing the thyristor into a low conductance high impedance state, and discharging the first charge type from the storage node and discharging the first charge type from the trapping insulator.

2. The method of claim 1, further comprising reading the storage node, including pulsing a gate of the access transistor and sensing a bit line for current attributed to stored charge on the storage node.

3. The method of claim 2, wherein reading the storage node includes determining that the first charge type was not stored on the storage node if current is not detected on the bit line.

4. The method of claim 2, wherein reading the storage node includes determining that the first charge type was stored on the storage node if current is detected on the bit line.

5. The method of claim 4, further comprising restoring charge on the storage node after determining the first charge type was stored on the storage node.

6. The method of claim 1, wherein storing the first charge type in the trapping insulator includes raising a potential of a floating body region of the access transistor.

7. The method of claim 1, wherein storing the first charge type in the storage node and storing the first charge type in the trapping insulator includes pulsing a gate of the access transistor and pulsing a bulk semiconductor region to a first reference potential.

8. The method of claim 1, wherein discharging the first charge type from the trapping insulator includes injecting a second charge type into a floating body of the access transistor.

9. The method of claim 1, wherein discharging the storage node of the memory cell includes storing a second charge type in the trapping insulator.

10. The method of claim 1, wherein storing the first charge type in the trapping insulator includes storing the first charge type in an oxy-nitride.

11. The method of claim 1, wherein the thyristor extends between an isolated semiconductor region and a bulk semiconductor region and is insulated from the floating body region by a thyristor gate insulator.

12. A method for operating a memory cell, comprising:
charging a storage node of the memory cell, including forward biasing a thyristor to switch the thyristor into a high conductance low impedance state, and storing a first charge type in the storage node and storing the first charge type in a trapping insulator separating a floating body of an access transistor from the thyristor;
discharging the storage node of the memory cell, including reverse biasing the thyristor into a low conductance high impedance state, and discharging the first charge type from the storage node and discharging the first charge type from the trapping insulator; and
reading the storage node, including pulsing a gate of the access transistor and sensing a bit line for current attributed to stored charge on the storage node, determining that the first charge type was not stored on the storage node if current is not detected on the bit line, and determining that the first charge type was stored on the storage node if current is detected on the bit line.

13. The method of claim 12, wherein storing the first charge type in the trapping insulator includes raising a potential of a floating body region of the access transistor.

14. The method of claim 12, wherein storing the first charge type in the storage node and storing the first charge type in the trapping insulator includes pulsing a gate of the access transistor and pulsing a bulk semiconductor region to a first reference potential.

15. The method of claim 12, wherein discharging the first charge type from the trapping insulator includes injecting a second charge type into a floating body of the access transistor.

16. The method of claim 12, wherein discharging the storage node of the memory cell includes storing a second charge type in the trapping insulator.

17. A method for operating a memory cell, comprising:
receiving a memory operation command;
in response to receiving a command to charge a storage node of the memory cell,
forward biasing a thyristor to switch the thyristor into a high conductance low impedance state, including gating the thyristor using a floating body of an access transistor that is capacitively coupled to a gate of the access transistor, wherein gating the thyristor includes pulsing the gate of the access transistor; and
storing a first charge type in the storage node and in a trapping insulator, the trapping insulator separating the floating body of the access transistor from the thyristor;
in response to receiving a command to discharge the storage node of the memory cell,
reverse biasing the thyristor to switch the thyristor into a low conductance high impedance state, including gating the thyristor using the floating body of the access transistor, wherein gating the thyristor includes pulsing the gate of the access transistor; and
discharging the first charge type from the storage node and storing a second charge type in the trapping insulator; and
in response to receiving a read command,
pulsing the gate of the access transistor and sensing a bit line for current attributed to stored charge on the storage node of the access transistor;
if current is detected, determining that charge was stored on the storage node, and restore charge on the storage node because of a read process; and
if current is not detected, determining that charge was not stored on the storage node.

18. The method of claim 17, wherein
forward biasing a thyristor to switch the thyristor into a high conductance low impedance state and storing a first charge type in the storage node and in a trapping insulator includes:
pulsing a reference potential for a thyristor anode to a first reference potential to forward bias the thyristor;
pulsing a potential of the gate of the access transistor to gate the thyristor via the capacitively-coupled floating body; and
reducing the reference potential pulse to a second reference potential, and pulsing a bit line potential to a first bit line potential during the gate potential pulse to operate the access transistor in saturation such that the generated charge is stored in the trapping layer;
reverse biasing the thyristor to switch the thyristor into a low conductance high impedance state and discharging the first charge type from the storage node and storing a second charge type in the trapping insulator includes:

pulsing the bit line potential to the first bit line potential;

pulsing the potential of the gate of the access transistor to gate the thyristor via a capacitively-coupled floating body and to turn on the access transistor to increase the potential of the storage node with respect to the reference potential; and pulsing the bit line potential to a second bit line potential during the gate potential pulse to forward bias a junction between the bit line and the floating body to reduce holes in the storage node and to inject electrons into the floating body and the trapping layer.

19. A method for operating a memory cell that includes an n-channel access transistor and a thyristor, the transistor including a floating body, a first diffusion region connected to a bit line, a second diffusion region to function as a storage node, and a gate separated from the floating body by a gate dielectric, the thyristor including a cathode integrally formed with the second diffusion region and an anode connected to a bulk semiconductor region, the method comprising:

storing holes in the storage node to write the memory cell into a first memory state, including:

pulsing the gate to a first gate potential, and pulsing the bulk semiconductor region to a first reference potential;

while pulsing the gate, pulsing the bit line to a first bit line potential and pulsing the bulk semiconductor to a reduced second reference potential;

removing holes from the storage node to write the memory cell into a second memory state, including:

pulsing the gate to the first gate potential; and while pulsing the gate, pulsing the bit line to the first bit line potential followed by pulsing the bit line to a reduced second bit line potential; and reading the memory cell, including pulsing the gate to the first gate potential and sensing the bit line for a current attributable to stored charge in the storage node.

20. The method of claim 19, wherein the first gate potential is approximately 2 volts, the first reference potential is approximately 1 volt, the reduced second reference potential is approximately 0.5 volts, the first bit line potential is approximately 2 volts, and the reduced second bit line potential is approximately—1.5 volts.

21. The method of claim 19, further comprising storing holes in a charge trapping thyristor gate when holes are stored in the storage node, and storing electrons in the charge trapping thyristor gate when holes are removed from the storage node.

* * * * *